US011810986B2

(12) United States Patent
Yang et al.

(10) Patent No.: US 11,810,986 B2
(45) Date of Patent: Nov. 7, 2023

(54) METHOD FOR INTEGRATING SURFACE-ELECTRODE ION TRAP AND SILICON PHOTOELECTRONIC DEVICE, INTEGRATED STRUCTURE, AND THREE-DIMENSIONAL STRUCTURE

(71) Applicant: Institute of Microelectronics, Chinese Academy of Sciences, Beijing (CN)

(72) Inventors: Yan Yang, Beijing (CN); Zhihua Li, Beijing (CN); Wenwu Wang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 382 days.

(21) Appl. No.: 17/121,396

(22) Filed: Dec. 14, 2020

(65) Prior Publication Data

US 2021/0151613 A1  May 20, 2021

Related U.S. Application Data

(63) Continuation of application No. PCT/CN2019/119912, filed on Nov. 21, 2019.

(30) Foreign Application Priority Data

Nov. 15, 2019 (CN) .......................... 201911120086.0
Nov. 15, 2019 (CN) .......................... 201911120744.6
Nov. 15, 2019 (CN) .......................... 201911121046.8

(51) Int. Cl.
*H01L 31/0232* (2014.01)
*H01L 31/028* (2006.01)
(Continued)

(52) U.S. Cl.
CPC .. *H01L 31/02327* (2013.01); *H01L 31/02005* (2013.01); *H01L 31/028* (2013.01); *H01L 27/1443* (2013.01); *H01L 31/107* (2013.01)

(58) Field of Classification Search
CPC . H01L 27/144–1446; H01L 31/02002–02005; H01L 31/0232–02327;
(Continued)

(56) References Cited

U.S. PATENT DOCUMENTS

| 5,247,168 A | 9/1993 | Pochelle et al. |
| 10,418,443 B1 | 9/2019 | Nordquist et al. |

(Continued)

FOREIGN PATENT DOCUMENTS

| CN | 1879397 A | 12/2006 |
| CN | 102915939 A | 2/2013 |

(Continued)

OTHER PUBLICATIONS

Mehta et al., "Integrated Optical Addressing of an Ion Qubit," Dept. of Electrical Engineering & Computer Science and Research Laboratory of Electronics, Massachusetts Institute of Technology, Cambridge, Massachusetts, Jul. 26, 2016.

(Continued)

*Primary Examiner* — Andres Munoz
(74) *Attorney, Agent, or Firm* — Goodwin Procter LLP

(57) ABSTRACT

A method for integrating a surface-electrode ion trap and a silicon optoelectronic device, and an integrated structure. A silicon structure and a grating are formed on a wafer. A first dielectric layer, a second dielectric layer, a third dielectric layer, and a fourth dielectric layer are sequentially deposited above the wafer. An epitaxy opening is provided in the first dielectric layer to form single-photon avalanche detectors. First contacts vias connecting the detectors, and through silicon vias reaching a back surface of the wafer, are provided in the second dielectric layer and the third dielectric layer, respectively. Electrodes, the second contact vias and the third contact vias are provided in the fourth dielectric layer. The first contact vias are connected to a first electrode (Continued)

via the second contact vias, and the through silicon vias are connected to the first electrode and a second electrode via the third contact vias.

20 Claims, 16 Drawing Sheets

(51) Int. Cl.
  *H01L 31/02* (2006.01)
  *H01L 27/144* (2006.01)
  *H01L 31/107* (2006.01)
(58) Field of Classification Search
  CPC ..... H01L 31/028; H01L 31/10; H01L 31/101; H01L 31/102; H01L 31/107–1075
  See application file for complete search history.

(56) References Cited

U.S. PATENT DOCUMENTS

| | | | |
|---|---|---|---|
| 2009/0079976 A1 | 3/2009 | Cunningham et al. | |
| 2012/0288971 A1* | 11/2012 | Bogaerts | H01L 31/105 438/57 |
| 2015/0325737 A1 | 11/2015 | Mazzillo et al. | |
| 2018/0260729 A1 | 9/2018 | Abdo et al. | |
| 2019/0067900 A1 | 2/2019 | Bhattacharya et al. | |
| 2019/0312654 A1 | 10/2019 | Han et al. | |
| 2020/0166703 A1* | 5/2020 | Charles | G02B 6/12004 |

FOREIGN PATENT DOCUMENTS

| | | |
|---|---|---|
| CN | 103199100 A | 7/2013 |
| CN | 103787268 A | 5/2014 |
| CN | 106783905 A | 5/2017 |
| CN | 109148637 A | 1/2019 |
| CN | 109742202 A | 5/2019 |
| CN | 110378482 A | 10/2019 |
| EP | 0477086 A1 | 3/1992 |
| EP | 1685701 B1 | 9/2008 |
| WO | WO2007052273 A2 | 5/2007 |

OTHER PUBLICATIONS

Tao et al., "Micro-fabricated Surface Electrode Ion Trap with 3D-TSV Integration for Scalable Quantum Computing," 2019 Electron Devices Technology and Manufacturing Conference (EDTM), pp. 300-302.
Tao et al., "3D Integration of CMOS-compatible Surface Electrode Ion Trap and Silicon Photonics for Scalable Quantum Computing," 2019 IEEE 69th Electronic Components and Technology Conference (ECTC), pp. 1735-1743.
1st Office Action in Chinese Appln. No. CN201911120744.6, dated Mar. 3, 2021.
International Search Report and Written Opinion, dated Aug. 20, 2020 in PCT/CN2019/119912.
Yang et al., 3D Silicon Photonics Packaging Based on TSV Interposer for High Density On-Board Optics Module, 2016 IEEE 66th Electronic Conference.
1st Office Action, in Chinese Appln. No. 201911120086.0, dated Sep. 3, 2020.

* cited by examiner

METHOD FOR INTEGRATING SURFACE-ELECTRODE ION TRAP AND SILICON PHOTOELECTRONIC DEVICE, INTEGRATED STRUCTURE, AND THREE-DIMENSIONAL STRUCTURE

This application is a continuation application of International Application No. PCT/CN2019/119912, titled "METHOD FOR MANUFACTURING SILICON OPTICAL INTERPOSER, METHOD FOR MANUFACTURING THREE-DIMENSIONAL STRUCTURE, METHOD FOR INTEGRATING SURFACE-ELECTRODE ION TRAP AND SILICON PHOTOELECTRONIC DEVICE, INTEGRATED STRUCTURE, AND THREE-DIMENSIONAL STRUCTURE," filed on Nov. 21, 2019, which claims the priority to Chinese Patent Applications No. 201911120086.0, titled "METHOD FOR MANUFACTURING SILICON OPTICAL INTERPOSER, AND METHOD FOR MANUFACTURING THREE-DIMENSIONAL STRUCTURE," No. 201911121046.8, titled "METHOD FOR INTEGRATING SURFACE-ELECTRODE ION TRAP AND SILICON PHOTOELECTRONIC DEVICE FOR ADDRESSING AND DETECTION, AND METHOD FOR MANUFACTURE AN INTEGRATED STRUCTURE," and No. 201911120744.6, "INTEGRATED STRUCTURE OF SURFACE-ELECTRODE ION TRAP AND SILICON PHOTOELECTRONIC DEVICE, AND THREE-DIMENSIONAL STRUCTURE," all filed on Nov. 15, 2019 with the China National Intellectual Property Administration, all of which are incorporated herein by reference in their entireties

FIELD

The present disclosure relates to the technical field of silicon-based optoelectronics, and in particular, to a method for manufacturing a silicon optical interposer, a method for manufacturing a three-dimensional structure, a method for integrating a surface-electrode ion trap and a silicon optoelectronic device, an integrated structure, and a three-dimensional structure.

BACKGROUND

Silicon-based optoelectronic technology is an effective means to surmount the Moore's law. A silicon optical interposer is an integrated monolithic structure of a silicon optoelectronic device and a through silicon via (TSV), and achieves electrical signal interconnections between upper and lower chips through the TSV. A method for manufacturing an optoelectronic three-dimensional structure based on silicon optical interposer technology is capable to reduce a package size of chips and improve a level of integration. Further, the manufactured three-dimensional structure has a smaller delay in electrical signals, a higher bandwidth, and a higher speed, in comparison with a conventional planar structure and a three-dimensional structure that is integrated through wire bonding.

A quantum bit is a basic operation unit in a quantum computer. An ion trap is an object for studying the quantum bits due to advantages of a long coherence time and high fidelity as a logic gate. A surface-electrode ion trap on a metal electrode (a radiofrequency electrode or a direct current electrode) is formed through photolithography at a surface of a substrate. Due to mature semiconductor photolithography technology, metal electrodes of various shapes can be formed on the surface of the substrate, and multiple identical metal electrodes and multiple silicon optoelectronic devices can be fabricated. Therefore, it is facilitated to increase a quantity of ion trapping regions and expand addressing and detection.

At present, multiple free-space laser sources and a photomultiplier are usually applied to the surface-electrode ion trap in addressing and detection of quantum bits. A system for adjusting an optical path for addressing/detection is complex, expensive, bulky, large in errors, and poor in scalability, which limits researches and development of quantum computing science.

SUMMARY

In view of the above, an objective of the present disclosure is to provide methods for manufacturing a silicon optical interposer and a three-dimensional structure, which enables a small package size of chips, a short delay of electrical signals, a large bandwidth and a high speed. Another objective of the present disclosure is to provide a method for integrating a surface-electrode ion trap and a silicon optoelectronic device, an integrated structure of a surface-electrode ion trap and a silicon optoelectronic device, and a three-dimensional structure, which are highly stable, miniaturized, universal, and scalable.

In order to achieve the above objectives, following technical solutions are provided according to embodiments of the present disclosure. A method for manufacturing a silicon optical interposer is provided, including:

providing a wafer, where a silicon optoelectronic device is formed on the wafer by etching for a waveguide, epitaxy, ion implantation, and fabricating a thermode, and the silicon optoelectronic device includes a passive silicon optoelectronic device and an active silicon optoelectronic device;

depositing a first dielectric layer on a top of the silicon optoelectronic device, and forming a first contact via downward from a top of the first dielectric layer through chemical mechanical polishing, for the active silicon optoelectronic device and/or a thermo-optic device in the passive silicon optoelectronic device;

depositing a second dielectric layer, and forming through silicon vias downward from a top of the second dielectric layer;

depositing a third dielectric layer, and forming, on a top of the third dielectric layer, an electrode corresponding to the thermo-optic device and/or the active silicon optoelectronic device, where each electrode corresponds to the first contact via and the through via, and a second contact via and a third contact via are formed downward from a bottom of each electrode, the second contact via is connected to the first contact via, and the third contact via is connected to the through silicon via;

performing chemical mechanical polishing on a top of the structure that has been formed, depositing a fourth dielectric layer, forming a bonding pad opening running through the fourth dielectric layer, and forming a first under micro-bump metal or a first micro-bump, where the bonding pad opening is located above the electrode;

grinding the wafer from a back surface to expose the through silicon vias;

depositing a passivation layer on the back surface of the wafer; and etching the passivation layer to form a passivation layer opening for the through silicon via; and forming a redistribution layer, and a second under micro-bump metal or a second micro-bump in the passivation layer opening, or forming a second under micro-bump metal or a second micro-bump in the passivation layer opening.

In a preferable embodiment, forming the first contact via downward from the top of the first dielectric layer includes:
  etching downward from the top of the first dielectric layer, to form a first hole;
  depositing a first isolation layer on a sidewall and a bottom of the first hole;
  coating the first hole electrochemically with a first metal, or depositing a first metal in the first hole; and
  removing the first metal and the first isolation layer that are on a surface of the first dielectric layer, through chemical mechanical polishing or etching.

In a preferable embodiment, the first metal is copper. The first hole is filled with the copper through electrochemical coating, and the copper is annealed and subject to chemical mechanical polishing. A first stop layer is deposited after forming the first contact via and before depositing the second dielectric layer.

In a preferable embodiment, forming the through silicon vias downward from the top of the second dielectric layer includes:
  etching downward from the top of the second dielectric layer, to form a second hole;
  depositing a second isolation layer on a sidewall and a bottom of the second hole;
  coating the second hole electrochemically with a second metal;
  removing the second metal and the second isolation layer that are on the surface of the second dielectric layer, through chemical mechanical polishing.

In a preferable embodiment, the second metal is copper. The second hole is filled with the copper through electrochemical coating, and the copper annealed and subject to chemical mechanical polishing. A second stop layer is deposited after forming the through silicon via and before depositing the third dielectric layer.

In a preferable embodiment, forming the electrode, the second contact via, and the third contact via includes:
  etching from the top of the third dielectric layer to form electrode grooves, and etching, downward from a bottom of each electrode groove, to form a third hole and a fourth hole;
  depositing a third isolation layer on sidewalls and bottoms, of the electrode grooves, the third hole, and the fourth hole;
  coating the electrode grooves, the third hole, and the fourth hole electrochemically with a third metal, or depositing a third metal in the electrode grooves, the third hole and the fourth hole; and
  removing the third metal and the third isolation layer that are on a surface of the third dielectric layer, through chemical mechanical polishing or etching.

In a preferable embodiment, the third metal is copper. The electrode grooves, the third hole, and the fourth hole are filled with the copper through electrochemical coating, and the copper is annealed and subject to chemical mechanical polishing. A third stop layer is deposited after forming the electrode groove, the third hole, and the fourth hole, and before depositing the fourth dielectric layer.

In a preferable embodiment, each of the first isolation layer, the second isolation layer, and the third isolation layer is made of Ta, TaN, or a combination of Ta and TaN.

In a preferable embodiment, each of the first dielectric layer, the second dielectric layer, the third dielectric layer, and the fourth dielectric layer is a dielectric layer of silicon dioxide.

In a preferable embodiment, each of the first stop layer, the second stop layer, and the third stop layer is made of silicon nitride.

In a preferable embodiment, each of the first dielectric layer, the second dielectric layer, the third dielectric layer, and the fourth dielectric layer is formed through plasma enhanced chemical vapor deposition.

In a preferable embodiment, each of the first hole, the third hole, the fourth hole, and the electrode grooves is formed through dry etching.

In a preferable embodiment, the second hole is formed through DRIE etching.

In a preferable embodiment, a perpendicular distance between each through silicon via and a side, of the thermo-optic device and/or the active silicon optoelectronic device, adjacent to said through silicon via is not less than 1.5 times a diameter of each through silicon via. A perpendicular distance between central axes of every two adjacent through silicon vias is not less than 3 times the diameter of each through silicon via.

In a preferable embodiment, the first under micro-bump metal is made of Cu/Ni/Au, and the first-micro bump is made of Cu/Ni/SnAg. The second under micro-bump metal is made of Cu/Ni/Au, and the second-micro bump is made of Cu/Ni/SnAg.

A method for manufacturing a three-dimensional structure is further provided, including:
  providing a silicon optical interposer manufactured by the aforementioned method for manufacturing a silicon optical interposer;
  bonding the silicon optical interposer to an electronic chip or an optoelectronic chip via the first under micro-bump metal or the first micro-bump; and
  bonding the silicon optical interposer to a silicon interposer via the redistribution layer and the second under micro-bump metal or the second micro-bump, or via the second under micro-bump metal or the second micro-bump; and connecting the silicon optical interposer to a package substrate via a third under micro-bump metal or a third micro-bump arranged on a back surface of the silicon optical interposer; or
  connecting the silicon optical interposer to a package substrate directly via the redistribution layer and the second under micro-bump metal or second micro-bump of the silicon optical interposer, or via the second under micro-bump metal or the second micro-bump silicon optical interposer of the silicon optical interposer.

In a preferable embodiment, the third under micro-bump metal is made of Cu/Ni/Au, and the third micro-bump is made of Cu/Ni/SnAg.

According to embodiments of the present disclosure, a silicon optoelectronic device and the through silicon vias are monolithically integrated, to form the silicon optical interposer. On a front surface of the silicon optical interposer, the first micro-bump or the first under micro-bump metal (UBM) that can be integrated with the electronic chip or the optoelectronic chip may be formed in the bonding pad opening through electrochemical coating process. On the back surface of the silicon optical interposer, the second micro-bump or the second under micro-bump metal that can be connected to the silicon interposer may be formed in the passivation layer opening through electrochemical coating process. Further, the silicon interposer may be integrated with the package substrate via the third micro-bump or the third under micro-bump metal arranged on the back surface of the silicon optical interposer, or the silicon interposer may be integrated with the package substrate via a lead. Alternatively, the silicon optical interposer may be directly connected to the package substrate. After the electronic chip or the optoelectronic chip is integrated with the package substrate via the silicon optical interposer, electrical signal interconnection between upper and lower chips can be implemented through the through silicon vias of the silicon optical interposer. Integration of the three-dimensional structure is based on integration of the through silicon vias and the silicon optoelectronic device, which reduces a size of the integrated chips and improves a degree integration. The manufactured three-dimensional structure has a smaller delay in electrical signal, a larger bandwidth, and a higher speed, in comparison with a conventional planar structure or a three-dimensional structure integrated through wire bonding.

A method for integrating a surface-electrode ion trap and a silicon optoelectronic device is further provided, including:

providing a wafer, where a silicon grating and a silicon structure are formed at a top of the wafer through photolithography and etching, and the silicon structure is subject to ion implantation and annealing;

depositing a first dielectric layer, etching the first dielectric layer above the silicon structure to form an epitaxy opening, growing silicon or germanium through epitaxy on a top of the silicon structure via the epitaxy opening, and performing ion implantation and annealing on the silicon or the germanium, to form a silicon single-photon avalanche detector or a silicon-based germanium single-photon avalanche detector;

depositing a second dielectric layer, and forming a first contact via downward from a top of the second dielectric layer through etching and performing chemical mechanical polishing, for the silicon single-photon avalanche detector or the silicon-based germanium single-photon avalanche detector of a surface-incident type;

depositing a third dielectric layer, and forming through silicon vias downward from a top of the third dielectric layer;

depositing a fourth dielectric layer, and forming an electrode on a top of the fourth dielectric layer, where the electrode includes a first electrode corresponds to the silicon single-photon avalanche detector or the silicon-based germanium single-photon avalanche detector and a second electrode for the surface-electrode ion trap, each first electrode corresponds to the first contact via and the through silicon via, each second electrode corresponds to the through silicon via, a second contact via is formed downward from a bottom of each first electrode, the second via is connected to the first contact via, a third contact via is formed downward from the bottom of each first electrode and a bottom of each second electrode, and the third contact via is connected to the through silicon via;

grinding the wafer from a back surface to expose the through silicon vias;

depositing a passivation layer on the back surface of the wafer; and etching the passivation layer to form a passivation layer opening for the through silicon via; and forming a redistribution layer, and a first under micro-bump metal or a first micro-bump in the passivation layer opening, or forming a first under micro-bump metal or a first micro-bump in the passivation layer opening.

In a preferable embodiment, forming the first contact via downward from the top of the second dielectric layer includes:

etching downward from the top of the second dielectric layer, to form a first hole;

depositing a first isolation layer on a sidewall and a bottom of the first hole;

coating the first hole electrochemically with a first metal, or depositing a first metal in the first hole;

removing the first metal and the first isolation layer that are on a surface of the second dielectric layer, through chemical mechanical polishing or etching.

In a preferable embodiment, the first metal is copper. The first hole is filled with the copper through electrochemical coating, and the copper is annealed and subject to chemical mechanical polishing. A first stop layer is deposited after forming the first contact via and before depositing the third dielectric layer.

In a preferable embodiment, forming the through silicon vias downward from the top of the third dielectric layer includes:

etching downward from the top of the third dielectric layer, to form a second hole;

depositing a second isolation layer on a sidewall and a bottom of the second hole;

coating the second hole electrochemically with a second metal;

removing the second metal and the second isolation layer that are on the surface of the third dielectric layer, through chemical mechanical polishing.

In a preferable embodiment, the second metal is copper. The second hole is filled with the copper through electrochemical coating, and the copper annealed and subject to chemical mechanical polishing. A second stop layer is deposited after forming the through silicon via and before depositing the fourth dielectric layer.

In a preferable embodiment, forming the electrode, the second contact via, and the third contact via includes:

etching from the top of the fourth dielectric layer to form electrode grooves, and etching, downward from a bottom of each electrode groove, to form a third hole and a fourth hole;

depositing a third isolation layer on sidewalls and bottoms, of the electrode grooves, the third hole, and the fourth hole;

coating the electrode grooves, the third hole, and the fourth hole electrochemically with a third metal, or depositing a third metal in the electrode grooves, the third hole and the fourth hole; and removing the third metal and the third isolation layer that are on a surface of the fourth dielectric layer, through chemical mechanical polishing or etching.

In a preferable embodiment, each of the first isolation layer, the second isolation layer, and the third isolation layer is made of Ta, TaN, or a combination of Ta and TaN.

In a preferable embodiment, each of the first dielectric layer, the second dielectric layer, the third dielectric layer, and the fourth dielectric layer is a dielectric layer of silicon dioxide.

In a preferable embodiment, each of the first stop layer and the second stop layer is made of silicon nitride.

In a preferable embodiment, each of the first dielectric layer, the second dielectric layer, the third dielectric layer, and the fourth dielectric layer is formed through plasma enhanced chemical vapor deposition.

In a preferable embodiment, each of the first hole, the third hole, the fourth hole, and the electrode grooves is formed through dry etching.

In a preferable embodiment, the second hole is formed through DRIE etching.

In a preferable embodiment, a perpendicular distance between each through silicon via and a side, of the silicon single-photon avalanche detector or the silicon-based germanium single-photon avalanche detector, adjacent to said through silicon via is not less than 1.5 times a diameter of each through silicon via. A perpendicular distance between central axes of every two adjacent through silicon vias is not less than 3 times the diameter of each through silicon via.

Another method for integrating a surface-electrode ion trap and a silicon optoelectronic device is further provided. The method includes:
- providing a wafer, where a silicon structure, or a silicon grating and a silicon structure, are formed at a top of the wafer through photolithography and etching, and the silicon structure is subject to ion implantation and annealing;
- depositing a first dielectric layer and a silicon nitride layer sequentially, and forming a silicon nitride grating at a top of the silicon nitride layer through photolithography and etching;
- depositing a second dielectric layer, etching the first dielectric layer and the second dielectric layer above the silicon structure to form an epitaxy opening, growing silicon or germanium through epitaxy on a top of the silicon structure via the epitaxy opening, and performing ion implantation and annealing on the silicon or the germanium, to form a silicon single-photon avalanche detector or a silicon-based germanium single-photon avalanche detector;
- depositing a third dielectric layer, and forming a first contact via downward from a top of the third dielectric layer through etching and performing chemical mechanical polishing, for the silicon single-photon avalanche detector or the silicon-based germanium single-photon avalanche detector of a surface-incident type;
- depositing a fourth dielectric layer, and forming through silicon vias downward from a top of the fourth dielectric layer;
- depositing a fifth dielectric layer, and forming an electrode on a top of the fifth dielectric layer, where the electrode includes a first electrode corresponds to the silicon single-photon avalanche detector or the silicon-based germanium single-photon avalanche detector and a second electrode for the surface-electrode ion trap, each first electrode corresponds to the first contact via and the through silicon via, each second electrode corresponds to the through silicon via, a second contact via is formed downward from a bottom of each first electrode, the second via is connected to the first contact via, a third contact via is formed downward from the bottom of each first electrode and a bottom of each second electrode, and the third contact via is connected to the through silicon via;
- grinding the wafer from a back surface to expose the through silicon vias;
- depositing a passivation layer on the back surface of the wafer; and
- etching the passivation layer to form a passivation layer opening for the through silicon via; and forming a redistribution layer, and a first under micro-bump metal or a first micro-bump in the passivation layer opening, or forming a first under micro-bump metal or a first micro-bump in the passivation layer opening.

A method for manufacturing a three-dimensional structure is further provided, including:
- bonding the integrated structure manufactured by the aforementioned method to a silicon interposer via the redistribution layer and the first under micro-bump metal or the first micro-bump, or via the first under micro-bump metal or the first micro-bump; and connecting the silicon optical interposer to a package substrate, via a second under micro-bump metal or a second micro-bump arranged on a back surface of the silicon optical interposer, or via a lead; or
- connecting the integrated structure to a package substrate directly via the redistribution layer and the first under micro-bump metal or first micro-bump of the integrated structure.

In a preferable embodiment, the second under micro-bump metal is made of Cu/Ni/Au, and the second micro-bump is made of Cu/Ni/SnAg.

An integrated structure of a surface-electrode ion trap and a silicon optoelectronic device is further provided, including:
- a wafer, where a silicon grating and a silicon structure are formed at a top of the wafer through photolithography and etching, and the silicon structure is subject to ion implantation and annealing;
- a first dielectric layer formed on the above-formed structure, where the first dielectric layer above the silicon structure is etched to form epitaxy openings, silicon or germanium is grown through epitaxy on a top of the silicon structure via the epitaxy opening, and ion implantation and annealing is performed to form silicon single-photon avalanche detectors or the silicon-based germanium single-photon avalanche detectors;
- a second dielectric layer formed on the above-formed structure, where first contact vias are formed downward from a top of the second dielectric layer for the silicon single-photon avalanche detectors or the silicon-based germanium single-photon avalanche detectors of a surface-incident type;
- a third dielectric layer formed on the above-formed structure, where through silicon vias are formed downward from a top of the third dielectric layer;
- a fourth dielectric layer formed on the above-formed structure, where electrodes are formed on a top of the fourth dielectric layer, the electrode includes a first electrode corresponds to the silicon single-photon avalanche detector or the silicon-based germanium single-photon avalanche detector and a second electrode for the surface-electrode ion trap, each first electrode corresponds to the first contact via and the through silicon via, each second electrode corresponds to the through silicon via, a second contact via is formed downward from a bottom of each first electrode, the second via is connected to the first contact via, a third contact via is formed downward from the bottom of each first electrode and a bottom of each second electrode, and the third contact via is connected to the through silicon via; and
- a first passivation layer deposited on a back surface of the wafer, where the back surface is grinded to expose the through silicon vias, and passivation layer openings for the through silicon vias are formed by etching the passivation layer, and a first under micro-bump metal or a first micro-bump is formed in each passivation layer opening, or a first under micro-bump metal or a first micro-bump is formed on a redistribution layer in each passivation layer opening.

In a preferable embodiment, each first contact via includes:
- a first hole, arranged in the second dielectric layer;
- a first isolation layer, deposited on a bottom and a sidewall of the first hole; and
- a first metal structure, with which the first hole with the first isolation layer is electrochemically coated, or which is deposited in the first hole with the first isolation layer.

In a preferable embodiment, the first metal structure is a copper structure. The first hole is filled with copper through electrochemical coating, and the copper is annealed and subject to chemical mechanical polishing, to form the copper structure. A first stop layer is deposited after forming the first contact via and before depositing the third dielectric layer.

In a preferable embodiment, each through silicon via includes:
- a second hole, arranged in the third dielectric layer;
- a second isolation layer, deposited on a sidewall and a bottom of the second hole; and
- a second metal structure, with which the second hole with the second isolation layer is electrochemically coated.

In a preferable embodiment, the second metal structure is a copper structure. The second hole is filled with copper through electrochemical coating, and the copper is annealed and subject to chemical mechanical polishing, to form the copper structure. A second stop layer is deposited after forming the through silicon vias and before depositing the fourth dielectric layer.

In a preferable embodiment, electrode grooves are formed by etching from the top of the fourth dielectric layer. A third hole and a fourth hole are formed by etching downward from a bottom of each electrode groove. A third isolation layer is deposited on sidewalls and bottoms of the electrode grooves, the third hole, and the fourth hole. The electrode grooves, the third hole, and the fourth hole with the third isolation layer are electrochemically coated with a third metal, or a third metal is deposited in the electrode grooves, the third hole and the fourth hole with the third isolation layer, to form a third metal structure.

In a preferable embodiment, the third metal structure is a copper structure. The electrode grooves, the third hole, and the fourth hole are filled with copper through electrochemical coating, and the copper is annealed and subject to chemical mechanical polishing, to form the copper structure.

In a preferable embodiment, a second passivation layer is deposited in the electrode grooves, the third hole, and the fourth hole, after the third isolation layer and the third metal structure are sequentially formed.

In a preferable embodiment, each of the first isolation layer, the second isolation layer, and the third isolation layer is made of Ta, TaN, or a combination of Ta and TaN.

In a preferable embodiment, each of the first dielectric layer, the second dielectric layer, the third dielectric layer, and the fourth dielectric layer is a dielectric layer of silicon dioxide.

In a preferable embodiment, each of the first stop layer and the second stop layer is made of silicon nitride.

In a preferable embodiment, a perpendicular distance between each through silicon via and a side, of the silicon single-photon avalanche detector or the silicon-based germanium single-photon avalanche detector, adjacent to said through silicon via is not less than 1.5 times a diameter of each through silicon via. A perpendicular distance between central axes of every two adjacent through silicon vias is not less than 3 times the diameter of each through silicon via.

Another integrated structure of a surface-electrode ion trap and a silicon optoelectronic device is provided, including:
- a wafer, where a silicon structure are formed at a top of the wafer through photolithography and etching, and the silicon structure is subject to ion implantation and annealing, or where a silicon grating and a silicon structure are formed at a top of the wafer through photolithography and etching, and the silicon structure is subject to ion implantation and annealing;
- a first dielectric layer and a silicon nitride layer, sequentially formed on the above-formed structure, where silicon nitride gratings are formed at a top of the silicon nitride layer through photolithograph and etching;
- a second dielectric layer formed on the above-formed structure, where the first dielectric layer and the second dielectric layer above the silicon structure is etched to form epitaxy openings, silicon or germanium is grown through epitaxy on a top of the silicon structure via the epitaxy opening, and ion implantation and annealing is performed to form silicon single-photon avalanche detectors or the silicon-based germanium single-photon avalanche detectors;
- a third dielectric layer formed on the above-formed structure, where first contact vias are formed downward from a top of the third dielectric layer for the silicon single-photon avalanche detectors or the silicon-based germanium single-photon avalanche detectors of a surface-incident type;
- a fourth dielectric layer formed on the above-formed structure, where through silicon vias are formed downward from a top of the fourth dielectric layer;
- a fifth dielectric layer formed on the above-formed structure, where electrodes are formed on a top of the fifth dielectric layer, the electrode includes a first electrode corresponds to the silicon single-photon avalanche detector or the silicon-based germanium single-photon avalanche detector and a second electrode for the surface-electrode ion trap, each first electrode corresponds to the first contact via and the through silicon via, each second electrode corresponds to the through silicon via, a second contact via is formed downward from a bottom of each first electrode, the second via is connected to the first contact via, a third contact via is formed downward from the bottom of each first electrode and a bottom of each second electrode, and the third contact via is connected to the through silicon via; and
- a first passivation layer deposited on a back surface of the wafer, where the back surface is grinded to expose the through silicon vias, and passivation layer openings for the through silicon vias are formed by etching the passivation layer, and a first under micro-bump metal or a first micro-bump is formed in each passivation layer opening, or a first under micro-bump metal or a first micro-bump is formed on a redistribution layer in each passivation layer opening.

A three-dimensional structure is further provided, including:
- the aforementioned integrated structure; and
- a silicon interposer and a package substrate, where the silicon interposer is bonded to the first under micro-bump metal or the first micro-bump of the integrated structure, and the package substrate is bonded to the silicon interposer via the second under micro-bump metal or a second micro bump arranged on the back surface of the silicon interposer, or bonded to the silicon interposer via a lead; or a package substrate, directly connected to the first under micro-bump metal or the first micro-bump of the integrated structure.

In a preferable embodiment, the second under micro-bump metal is made of Cu/Ni/Au, and the second micro-bump is made of Cu/Ni/SnAg.

According to embodiments of the present disclosure, the surface-electrode ion trap is integrated with the silicon single-photon avalanche detector or the silicon-based germanium single-photon avalanche detector, with the silicon grating and/or the silicon nitride grating, and with a through silicon via. Ions are trapped within a certain range by the surface-electrode ion trap after being powered. A laser source is coupled to the silicon grating and/or the silicon nitride grating through a coupling manner, such as end-coupling. Laser is emitted to the ions in three directions via the silicon gratings and/or the silicon nitride gratings, so as to achieve addressing. The ions are subject to energy level transition after being excited by the laser, and emit fluorescence after the energy level transition. The fluorescence is detected by the silicon single-photon avalanche detector or the silicon-based germanium single-photon avalanche detector, and therefore information of the quantum bits is detected. Compared with conventional addressing and detection in a free spatial domain, a system for adjusting a light path is simplified, requirements of planning and adjusting the light path on space are reduced, the integrated chip is miniaturized, and a degree of integration is improved. It is avoided that the light path is unstable due to interference of external factors such as vibration, when the addressing and detection is in a free-space manner. Moreover, a same integration method may be adopted to integrate adequate silicon single-photon avalanche detectors or the silicon-based germanium single-photon avalanche detectors, through silicon vias, and silicon gratings and/or silicon nitride gratings, according to a quantity of ions required to be trapped in the addressing and detection, which provides good versatility and scalability.

REFERENCE NUMERALS

| | |
|---|---|
| 100 Wafer; | 1001 Substrate; |
| 1002 Buried oxide layer; | |
| 101 Silicon grating; | 102 Silicon structure; |
| 103 First dielectric layer; | 104 Opening; |
| 105 Silicon or germanium; | |
| 106 Silicon single-photon avalanche detector or the silicon-based germanium single-photon avalanche detector; | |
| 107 Second dielectric layer; | 108 First contact via; |
| 1080 First hole; | |
| 109 Third dielectric layer; | 110 Through silicon via; |
| 1100 Second hole; | |
| 111 Fourth dielectric layer; | 112-1 First electrode; |
| 112-2 Second electrode; | 1120 Electrode groove; |
| 113 Second contact via; | 1130 Third hole; |
| 114 Third contact via; | 1140 Fourth hole; |
| 115 First passivation layer; | |
| 116 First under micro-bump metal or first micro-bump; | |
| 200 Wafer; | 201 Silicon grating; |
| 202 Silicon structure; | 203 First dielectric layer; |
| 204 Silicon nitride grating; | 205 Second dielectric layer; |
| 206 Silicon or germanium; | |
| 207 Silicon single-photon avalanche detector or the silicon-based germanium single-photon avalanche detector; | |
| 208 Third dielectric layer; | 209 First contact via; |
| 210 Fourth dielectric layer; | 211 Through silicon via; |
| 212 Fifth dielectric layer; | 213-1 First Electrode; |
| 213-2 Second electrode; | 214 Second contact via; |
| 215 Third contact via; | 216 First passivation layer; |
| 217 First under micro-bump metal or first micro-bump; | |
| 10/20 Integrated structure; | 30 Silicon interposer; |
| 40 Package substrate; | |
| 50 Second under micro-bump metal or second micro-bump; | |
| 60 Lead; | |

DETAILED DESCRIPTION OF EMBODIMENTS

Hereinafter embodiments of the present disclosure are described in conjunction with the drawings.

Hereinafter various specific details are set forth in order to fully understand the present disclosure. The present disclosure may further be implemented in manners other than those described herein. Therefore, the present disclosure is not limited to the specific embodiments disclosed below.

In order to improve a degree of chip integration and reduce a delay of an electrical signal, a method for manufacturing a silicon optical interposer and a method for manufacturing a three-dimensional structure are provided according to embodiments of the present disclosure.

Figure 1:
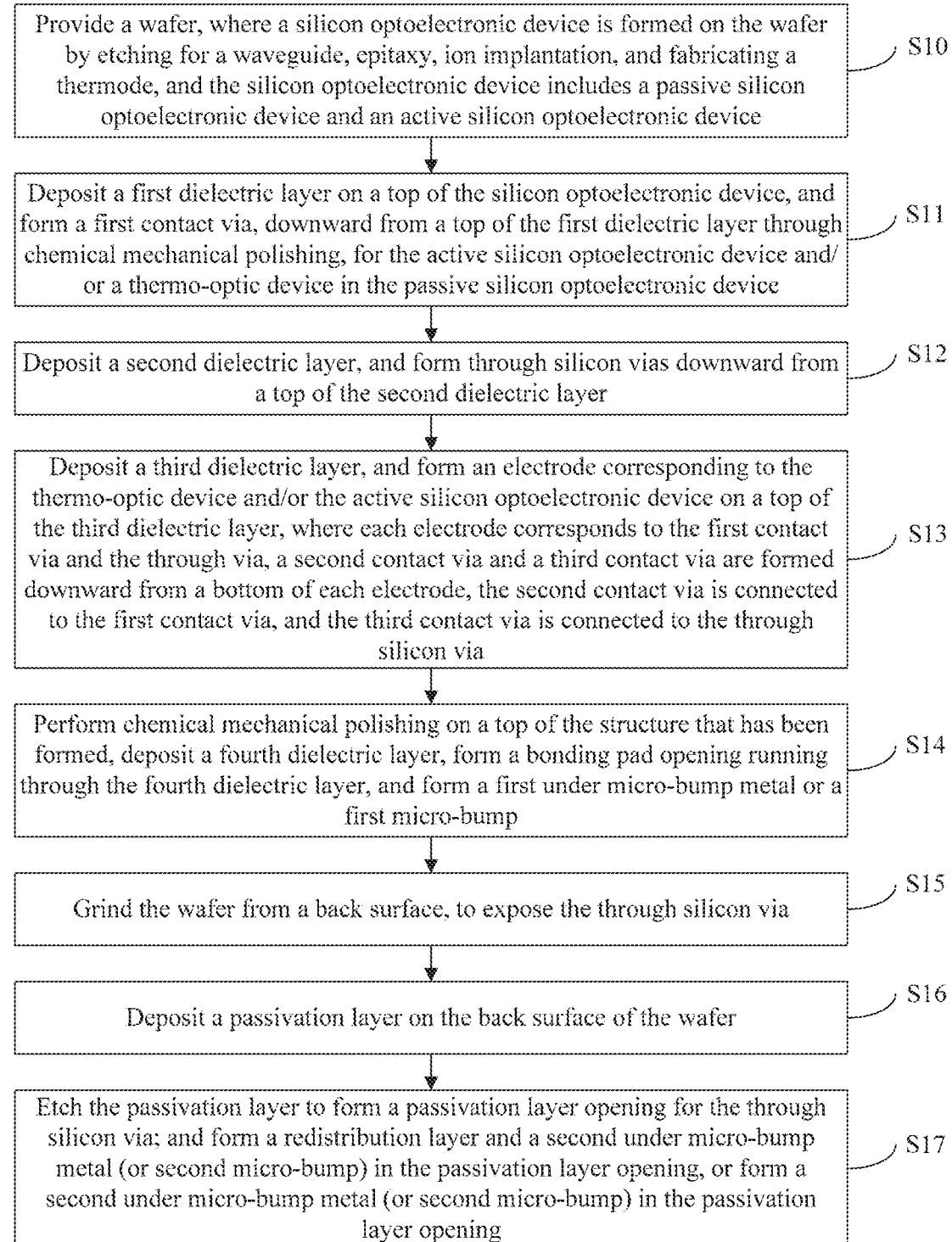
FIG. 1 is a flowchart of a method for manufacturing a silicon optical interposer according to an embodiment of the present disclosure.

FIG. 1 is a flowchart of a method for manufacturing a silicon optical interposer according to an embodiment of the present disclosure. The method includes following steps S10 to S17.

In step S10, a wafer is provided. A silicon optoelectronic device is formed on the wafer by etching for a waveguide, epitaxy, ion implantation, and fabricating a thermode. The silicon optoelectronic device includes a passive silicon optoelectronic device and an active silicon optoelectronic device.

In a preferable embodiment, the wafer in this step is an SOI (Silicon-On-Insulator) wafer with a high-impedance substrate. The SOI wafer includes a top silicon, a back substrate, and a buried oxide layer between the two.

A process of etching for the waveguide, epitaxy, ion implantation, and fabricating the thermode involve auxiliary processes, which may refer to mature techniques for the silicon optoelectronic device. Such techniques may not be key improvements according to embodiments of the present disclosure, and thereby are not described herein.

The silicon optoelectronic device includes the passive silicon optoelectronic device and the active silicon optoelectronic device. The passive silicon optoelectronic device may include, but is not limited to, a silicon waveguide or a silicon nitride waveguide, a grating, an arrayed waveguide grating, a micro-ring resonator, a multimode interferometer, a thermo-optic device, or the like. The active silicon optoelectronic device may include, but is not limited to, a modulator or a detector.

It should be noted that each of the thermo-optic device in the passive silicon optoelectronic device and the active silicon optoelectronic device is required to be powered.

In step S11, a first dielectric layer is deposited on a top of the silicon optoelectronic device, and a first contact via is formed, downward from a top of the first dielectric layer through chemical mechanical polishing, for the active silicon optoelectronic device and/or a thermo-optic device in the passive silicon optoelectronic device.

In this step, the first dielectric layer may be deposited on a top of the silicon optoelectronic device through vapor-phase deposition, such as plasma enhanced chemical vapor deposition. The first dielectric layer may be a dielectric layer of silicon dioxide.

After the first dielectric layer is deposited, the first contact via for the thermo-optic device and/or the silicon photoactive device is formed downward from the top of the first dielectric layer.

For example, the first contact via may be formed through a copper process, a tungsten process, a gold process, an aluminum process, or an aluminum-copper process.

Hereinafter the single copper damascene process is taken as an example to illustrate a manner of forming the first contact via in detail.

A top of the first dielectric layer is dry etched downward to form multiple first holes. An aperture of the first hole is not limited herein, and may be properly configured according to a practical processing condition.

A first isolation layer is deposited on a sidewall and a bottom of the first hole. The first isolation layer may be made of Ta, TaN, or Ta+TaN. The first isolation layer is deposited on an overall structure with the first hole. That is, the first isolation layer is also deposited on the top of the first dielectric layer, when being deposited on the sidewall and the bottom of the first hole.

Afterwards, a first copper-seed layer is deposited in the first hole, which has been provided with the first isolation layer. Similarly, the first copper-seed layer is also deposited on the top of the first dielectric layer, i.e. on the top of the first isolation layer.

Afterwards, copper is filled into the first hole, which has been provided with the first isolation layer and the first copper-seed layer, through an electrochemical coating process (ECP). Similarly, the copper is also deposited on top of the first dielectric layer, i.e. on a top of the first copper-seed layer.

Afterwards, annealing and chemical mechanical polishing are performed to remove the copper, the first copper-seed layer, and the first isolation layer, which are located on a surface of the first dielectric layer. Thereby, the first contact via flush with the top of the first dielectric layer is formed by the first hole, and the first isolation layer, the first copper-seed layer and the copper that are located in the first hole.

The first contact via is in contact with the thermo-optic device and/or the active silicon optoelectronic device, and is capable of connecting the thermo-optic device and/or the active silicon optoelectronic device to an electrode. Thereby, the thermo-optic device and/or the active silicon active device can be powered.

After the first contact via is formed by the single copper damascene process, a first stop layer is required to be deposited on the top of the formed structure, so as to prevent the copper from being oxidized in a subsequent process. The first stop layer may be made of silicon nitride.

In a case that the first contact via is formed by the copper process or the gold process, copper or gold is formed in the first hole through electrochemical coating. The copper is annealed and subject to chemical mechanical polishing in the copper process, and the gold is subject to chemical mechanical polishing in the gold process. In a case that the first contact via is formed by the aluminum process or the aluminum-copper process, aluminum or aluminum-copper is deposited in the first hole and then etched. In a case that the first contact via is formed by the tungsten process, tungsten is deposited in the first hole, and then is subject to chemical mechanical polishing.

In step S12, a second dielectric layer is deposited, and through silicon vias are formed downward from a top of the second dielectric layer.

In this step, the second dielectric layer may be deposited on a top of the silicon optoelectronic device, which has been provided with the first contact via, through vapor-phase deposition such as plasma enhanced chemical vapor deposition. That is, the first contact via and the first dielectric layer, or the first contact via and the first stop layer, are completely covered by the second dielectric layer. The second dielectric layer may be a dielectric layer of silicon dioxide.

After the second dielectric layer is deposited, the through silicon vias are formed downward from the top of the second dielectric layer.

The through silicon via may be formed be formed through a copper process, a tungsten process, or a gold process, and usually through the copper process.

Hereinafter the single copper damascene process is taken as an example to illustrate a manner of forming the through silicon via in detail.

A second hole may be formed through DRIE etching. An aperture of the second hole is not limited herein, and may be may be properly configured according to a practical requirement and a DRIE processing condition.

A second isolation layer is deposited on a sidewall and a bottom of the second hole. The second isolation layer may be made of Ta, TaN, or Ta+TaN. The second isolation layer is deposited on an overall structure with the second hole. That is, the second isolation layer is also deposited on the top of the second dielectric layer, when being deposited on the sidewall and the bottom of the second hole.

Afterwards, a second copper-seed layer is deposited in the second hole, which has been provided with the second isolation layer. Similarly, the second copper-seed layer is also deposited on the top of the second dielectric layer, i.e. on the top of the second isolation layer.

Afterwards, copper is filled into the second hole, which has been provided with the second isolation layer and the second copper-seed layer, through an electrochemical coating process. Similarly, the copper is also deposited on top of the second dielectric layer, i.e. on a top of the second copper-seed layer.

Afterwards, annealing and chemical mechanical polishing are performed to remove the copper, the second copper-seed layer, and the second isolation layer, which are located on a surface of the second dielectric layer. Thereby, the through silicon via flush with the top of the second dielectric layer is formed by the second hole, and the second isolation layer, the second copper-seed layer and the copper that are located in the second hole.

After the through silicon via is formed by the single copper damascene process, a second stop layer is required to be deposited on the top of the formed structure, so as to prevent the copper from being oxidized in a subsequent process. The second stop layer may be made of silicon nitride.

There are multiple through silicon vias, which are distributed around the thermo-optic device and/or the active silicon optoelectronic device. There is a distance between each through silicon via and the thermo-optic device and/or the active silicon optoelectronic device.

For example, a perpendicular distance between each through silicon via and a side, of the thermo-optic device and/or the active silicon optoelectronic device, adjacent to said through silicon via is not less than 1.5 times a diameter of each through silicon via. A perpendicular distance between central axes of every two adjacent through silicon vias is not less than 3 times the diameter of each through silicon via.

A preferable distance is set between the through silicon via and the thermo-optic device and/or the active silicon optoelectronic device, and another preferable distance is set between adjacent through silicon vias. Thereby, it is prevented that stress at a through silicon via deteriorates a performance of the thermo-optic device and/or active silicon optoelectronic device, or deteriorates formation of another through silicon via.

In a case that the through silicon via is formed by the copper process or the gold process, copper or gold is formed in the first hole through electrochemical coating. The copper is annealed and subject to chemical mechanical polishing in the copper process, and the gold is subject to chemical mechanical polishing in the gold process. In a case that the through silicon via is formed by the tungsten process, tungsten is deposited in the first hole, and then is subject to chemical mechanical polishing.

In step S13, a third dielectric layer is deposited, and an electrode corresponding to the thermo-optic device and/or the active silicon optoelectronic device is formed on a top of the third dielectric layer. Each electrode corresponds to the first contact via and the through via. A second contact via and a third contact via are formed downward from a bottom of each electrode, the second contact via is connected to the first contact via, and the third contact via is connected to the through silicon via.

In this step, the third dielectric layer may be deposited on a top of the silicon optoelectronic device, which has been provided with the first contact via and the silicon through via, through vapor-phase deposition such as plasma enhanced chemical vapor deposition. That is, the through silicon via and the second dielectric layer, or the through silicon via and the second stop layer, are completely covered by the third dielectric layer. The third dielectric layer may be a dielectric layer of silicon dioxide.

After the third dielectric layer is formed, the electrode, the second contact via, and the third contact via are formed downward from the top of the third dielectric layer.

Each of the electrode, the second contact via, and the third contact via may be formed by through a copper process, a tungsten process, a gold process, an aluminum process, or an aluminum-copper process.

Hereinafter the single copper damascene process is taken as an example to illustrate a manner of forming the electrode, the second contact via, and the third contact via in detail.

The third dielectric layer is etched through a conventional etching technique, such as dry etching, to form an electrode groove corresponding to the thermo-optic device and/or the active silicon optoelectronic device. A bottom of the electrode groove is further etched downward to form a third hole corresponding to the first contact via and a fourth hole corresponding to the through silicon via.

A third isolation layer is deposited on sidewalls and bottoms of the electrode groove, the third hole, and the fourth hole. The third isolation layer may be made of Ta, TaN, or Ta+TaN. The third isolation layer is deposited on an overall structure, which includes the electrode groove, the third hole, and the fourth hole. That is, the third isolation layer is also deposited on the top of the third dielectric layer, when being deposited on the sidewalls and the bottoms of the electrode groove, the third hole, and the fourth hole.

Afterwards, a third copper-seed layer is deposited in the electrode groove, the third hole and the fourth hole, which have been provided with the third isolation layer. The third copper-seed layer is also deposited on the top of the third dielectric layer, i.e. on the top of the third isolation layer.

Copper is filled into the electrode groove, the third hole, and the fourth hole, which have been provided with the third isolation layer and the third copper-seed layer, through an electrochemical coating process. Similarly, the copper is also deposited on top of the third dielectric layer, i.e. on a top of the third copper-seed layer.

Afterwards, annealing and chemical mechanical polishing are performed to remove the copper, the third copper-seed layer, and the third isolation layer, which are located on a surface of the third dielectric layer.

The electrode corresponding to the thermo-optic device and/or the active silicon optoelectronic device is formed by the electrode groove, the third isolation layer, the third copper-seed layer, and the copper. The second contact via is formed by the third hole, the third isolation layer, the third copper-seed layer, and the copper. The electrode and the first contact via are connected by the second contact via, and thereby the electrode is connected to the thermo-optic device and/or the active silicon optoelectronic device. The third contact via is formed by the fourth hole, the third isolation layer, the third copper-seed layer, and the copper. The electrode and the through silicon via are connected by the third contact via, and thereby the electrode is connected to a bottom of the silicon optical interposer.

A grid-type dielectric isolation structure is required to be arranged, in a case that a feature size of the electrode is greater than 20 microns and the electrode is formed by a dual copper damascene process. Thereby, it is prevented that a surface of the copper is concaved due to subsequent chemical mechanical polishing.

In a case that the electrode, the second contact via, and the third contact via are formed by the copper process or the gold process, copper or gold is formed in the electrode grove, the third hole, and the fourth hole, through electrochemical coating. The copper is annealed and subject to chemical mechanical polishing in the copper process, and the gold is subject to chemical mechanical polishing in the gold process. In a case that the electrode, the second contact via, and the third contact via are formed by the aluminum process or the aluminum-copper process, aluminum or aluminum-copper is deposited in the electrode grove, the third hole, and the fourth hole, and then etched. In a case that the electrode, the second contact via, and the third contact via are formed by the tungsten process, tungsten is deposited in the electrode grove, the third hole, and the fourth hole, and then is subject to chemical mechanical polishing.

In a case that the electrode is formed through the copper process, a third stop layer is deposited after the chemical mechanical polishing is performed on the top of the formed structure and before the fourth dielectric layer is deposited. The third stop layer may be made of silicon nitride.

In step S14, chemical mechanical polishing is performed on a top of the structure that has been formed, a fourth dielectric layer is deposited, a bonding pad opening (BPO) running through the fourth dielectric layer is formed, and a first under micro-bump metal or a first micro-bump is formed.

In this step, after the electrode, the second contact via, and the third contact are formed, the chemical mechanical polishing is performed on the top of the formed structure, and the fourth dielectric layer is deposited. The fourth dielectric layer may be a dielectric layer of silicon oxide.

After being deposited, the fourth dielectric layer is etched to form the bonding pad. In a preferable embodiment, the first under micro-bump metal is formed in the bonding pad opening through electrochemical coating. Alternatively, the first micro-bump is formed in the bonding pad opening through electrochemical coating.

In step S15, the wafer is grinded from a back surface of the wafer, to expose the through silicon via.

In this step, the front surface of the structure that has been formed may be temporarily bond to a carrier wafer, via a thermoplastic material. The carrier wafer may be a bulk silicon wafer.

The wafer is grinded from the back surface of the wafer thorough a conventional polishing process, so that the wafer is thinned to expose the through silicon via.

In step S16, a passivation layer is deposited on the back surface of the wafer.

In step S17, the passivation layer is etched to form a passivation layer opening for the through silicon via. Further, a redistribution layer and a second under micro-bump metal, or a redistribution layer and a second micro-bump, are formed in the passivation layer opening. Alternatively, a second under micro-bump metal or a second micro-bump is formed in the passivation layer opening.

In a preferable embodiment, the second micro-bump is formed in the passivation layer opening in this step, through electrochemical coating.

Alternatively, the second under micro-bump metal is formed in the passivation layer opening through electrochemical coating.

Based on the above embodiments, the first under micro-bump metal is made of Cu/Ni/Au, and the first micro-bump is made of Cu/Ni/SnAg.

Figure 2:
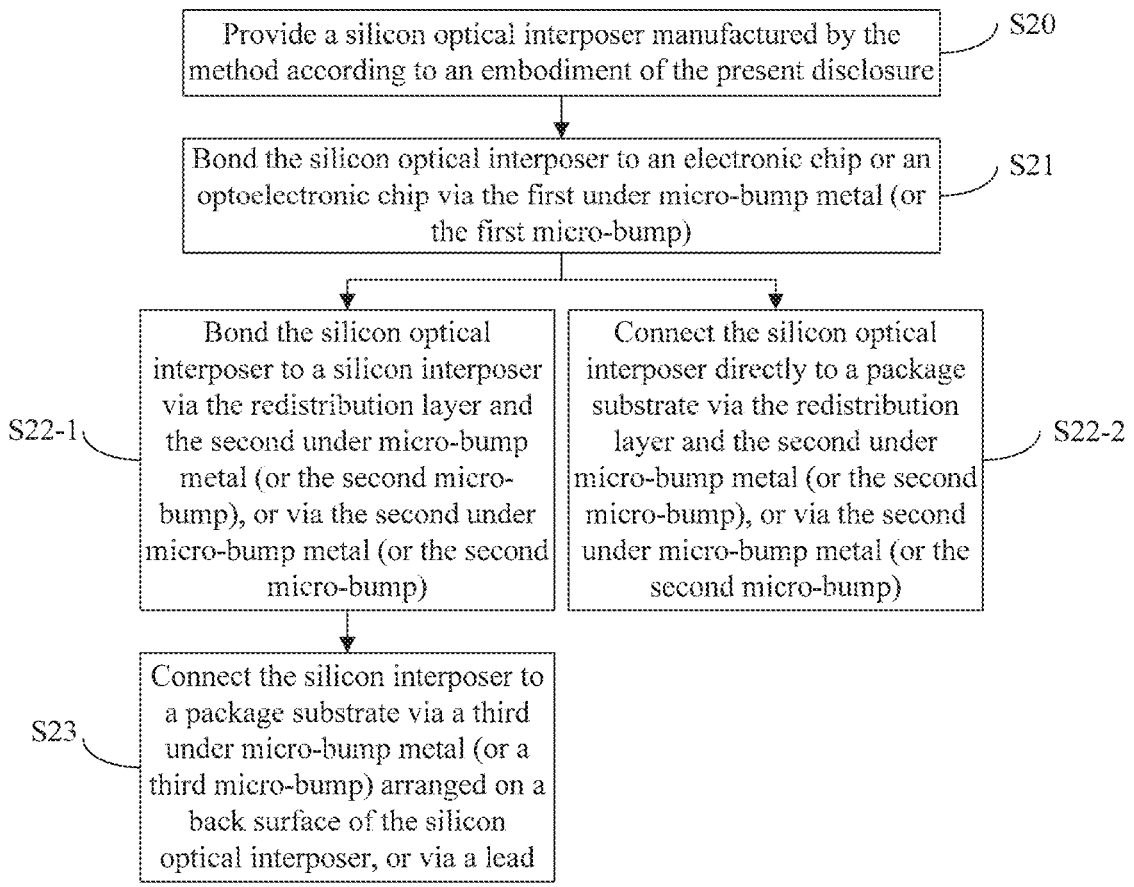
FIG. 2 is a flowchart of a method for manufacturing a three-dimensional structure according to an embodiment of the present disclosure.

A method for manufacturing a three-dimensional structure is further provided according to an embodiment of the present disclosure. The method includes following steps S20 to S23 (as shown in FIG. 2).

In step S20, a silicon optical interposer manufactured by the aforementioned method is provided.

In step S21, the silicon optical interposer is bonded to an electronic chip or an optoelectronic chip via the first under micro-bump metal or the first micro-bump.

In step S22, the silicon optical interposer is bonded to a silicon interposer via the redistribution layer and the second under micro-bump metal, or via the redistribution layer and the second micro-bump. Alternatively, the silicon optical interposer is bonded to a silicon interposer via the second under micro-bump metal or the second micro-bump.

In step S23, the silicon interposer is connected to a package substrate via a third under micro-bump metal or a third micro-bump arranged on a back surface of the silicon optical interposer. Alternatively, the silicon interposer is bonded to a package substrate via a lead.

In an alternative embodiment, the silicon optical interposer is directly connected to a package substrate via the redistribution layer and the second under micro-bump metal, or via the redistribution layer and second micro-bump. Or, the silicon optical interposer is directly connected to a package substrate via the second under micro-bump metal or the second micro-bump.

Based on the above embodiments, the third under micro-bump metal is made of Cu/Ni/Au, and the third micro-bump is made of Cu/Ni/SnAg.

According to above embodiments of the present disclosure, a silicon optoelectronic device and the through silicon vias are monolithically integrated, to form the silicon optical interposer. On a front surface of the silicon optical interposer, the first micro-bump or the first under micro-bump metal (UBM) that can be integrated with the electronic chip or the optoelectronic chip may be formed in the bonding pad opening through electrochemical coating process. On the back surface of the silicon optical interposer, the second micro-bump or the second under micro-bump metal that can be connected to the silicon interposer may be formed in the passivation layer opening through electrochemical coating process. Further, the silicon interposer may be integrated with the package substrate via the third micro-bump or the third under micro-bump metal arranged on the back surface of the silicon optical interposer, or the silicon interposer may be integrated with the package substrate via a lead. Alternatively, the silicon optical interposer may be directly connected to the package substrate. After the electronic chip or the optoelectronic chip is integrated with the package substrate via the silicon optical interposer, electrical signal interconnection between upper and lower chips can be implemented through the through silicon vias of the silicon optical interposer. Integration of the three-dimensional structure is based on integration of the through silicon vias and the silicon optoelectronic device, which reduces a size of the integrated chips and improves a degree integration. The manufactured three-dimensional structure has a smaller delay in electrical signal, a larger bandwidth, and a higher speed, in comparison with a conventional planar structure or a three-dimensional structure integrated through wire bonding.

A method for integrating a surface-electrode ion trap and a silicon optoelectronic device is further provided according to embodiments of the present disclosure, so as to address a technical problem of complicated adjustment of a light path, poor stability, and poor scalability in convention addressing/detection of quantum bits.

Figure 3:
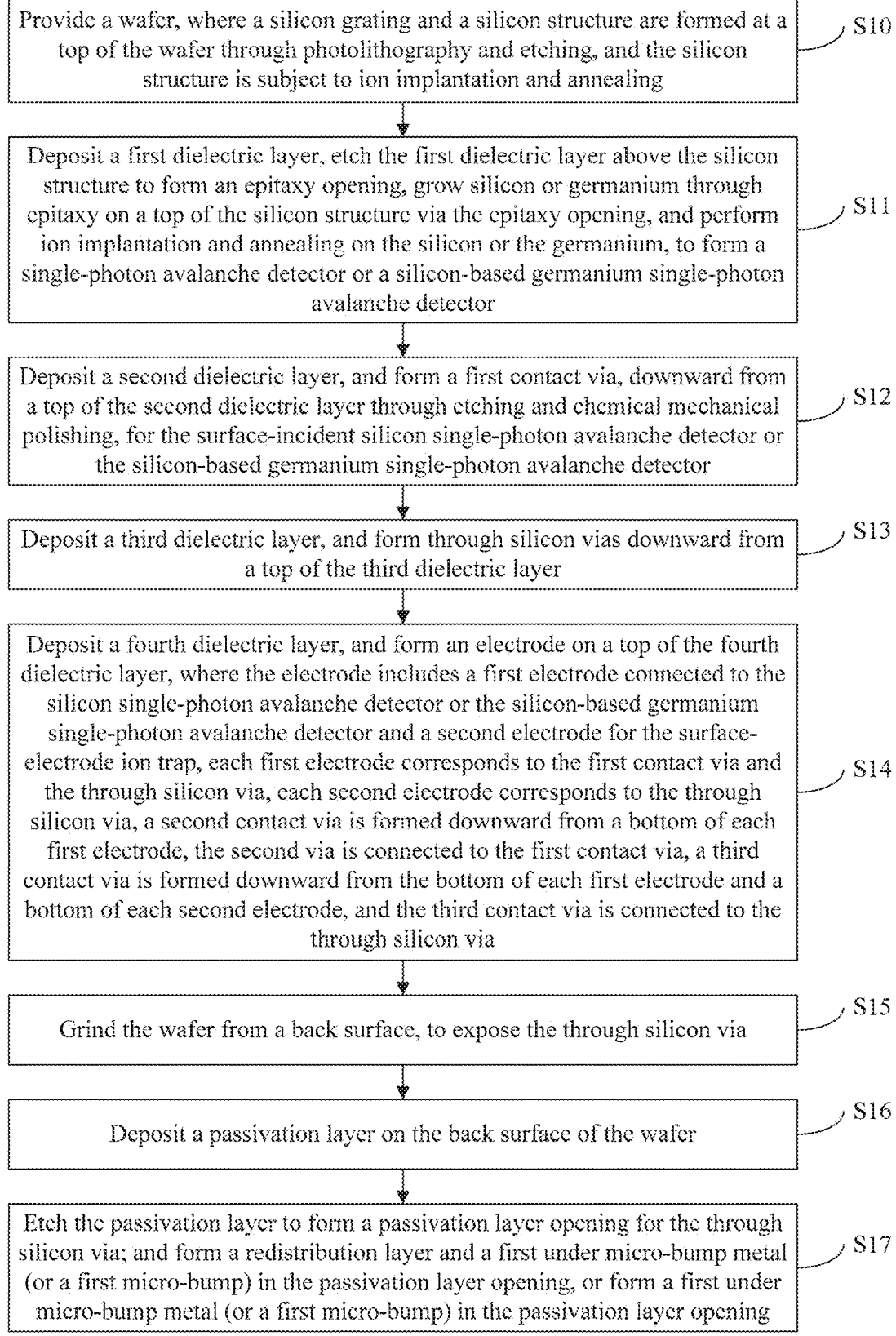
FIG. 3 is a flowchart of a method for integrating a surface-electrode ion trap and a silicon optoelectronic device according to an embodiment of the present disclosure.

FIG. 3 is a flowchart of a method for integrating a surface-electrode ion trap and a silicon optoelectronic device according to a first embodiment of the present disclosure. The method for integrating a surface-electrode ion trap and a silicon optoelectronic device includes following steps S10 to S17.

In step S10, a wafer is provided. A silicon grating and a silicon structure are formed at a top of the wafer through photolithography and etching, and the silicon structure is subject to ion implantation and annealing.

In a preferable embodiment, the wafer in this step is an SOI (Silicon-On-Insulator) wafer with a high-impedance substrate. The SOI wafer includes a top silicon, a back substrate, and a buried oxide layer between the two.

The top silicon is subject to conventional photolithography and etching techniques, so as to form the silicon grating. The silicon grating is capable to deflect a laser of a certain wavelength at an angle, which is determined based on a micro-nano structure thereof.

A silicon structure is formed from the top silicon together with the silicon grating. That is, the silicon structure and the silicon grating are formed in a same process under a same parameter of the process.

After being formed, the silicon structure is subject to ion implantation and annealing through a conventional technique. The implanted ions are boron for p-type doping, or phosphorus for n-type doping.

In step S11, a first dielectric layer is deposited, the first dielectric layer above the silicon structure is etched to form an epitaxy opening, silicon or germanium are grown through epitaxy on a top of the silicon structure via the epitaxy opening, and ion implantation and annealing are performed on the silicon or the germanium, to form a single-photon avalanche detector or a silicon-based germanium single-photon avalanche detector.

In a preferable embodiment, the first dielectric layer is deposited on the top of the wafer, which has been provided with the silicon grating and the silicon structure, in this step through plasma enhanced chemical vapor deposition (PECVD). In a preferable embodiment, the first dielectric layer is a dielectric layer of silicon dioxide. Alternatively, the first dielectric layer may be of another material capable of isolating.

In a preferable embodiment, after being deposited, the first dielectric layer is subject to low-temperature annealing and chemical mechanical polishing (CMP).

Alternatively, after being deposited, the first dielectric layer is not subject to low-temperature annealing and chemical mechanical polishing.

The epitaxy opening is formed by etching the first dielectric layer above the silicon structure. The silicon or the germanium is grown through epitaxy on the top of the silicon structure via the epitaxy opening. That is, the silicon or the germanium is formed in a cavity formed by the top of the silicon structure and the epitaxy opening. The silicon or the germanium is then subject to ion implantation and annealing, to form the silicon single-photon avalanche detector or the silicon-based germanium single-photon avalanche detector. The implanted ions are boron for p-type doping, or phosphorus for n-type doping. The silicon single-photon avalanche detector or the silicon-based germanium single-photon avalanche detector includes an absorption layer, a charge layer, and a multiplication layer in physics. The silicon single-photon avalanche detector or the silicon-based germanium single-photon avalanche detector is configured to detect fluorescence generated due to energy level transition of ions.

In a preferable embodiment, when viewed from the top of the formed structure, coverage of the epitaxial silicon or the epitaxial germanium is smaller that of the silicon structure, and the epitaxial silicon or the epitaxial germanium is located at a center of the silicon structure.

The silicon structure is formed by etching the top silicon of the wafer, the silicon or the germanium is grown through epitaxy, and then the silicon or the germanium is subject to ion implantation and annealing. Thereby, the silicon single-photon avalanche detector or the silicon-based germanium single-photon avalanche detector is integrated on the wafer, with a high degree of integration and a small size.

Figure 22:
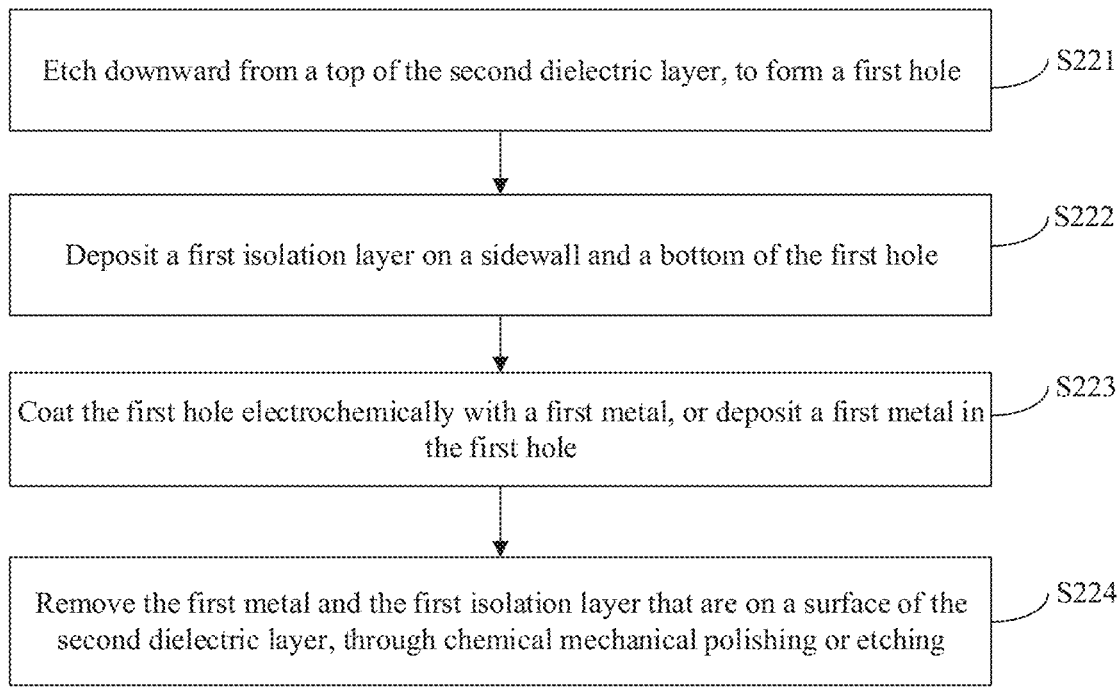
FIG. 22 is a flowchart of sub-steps in depositing a second dielectric layer according to an embodiment of the present disclosure.

In step S12, a second dielectric layer is deposited, and a first contact via is formed, downward from a top of the second dielectric layer through etching and chemical mechanical polishing, for the surface-incident silicon single-photon avalanche detector or the silicon-based germanium single-photon avalanche detector. Sub-steps of the step S12 may refer to steps S221 to S224 as shown in FIG. 22.

In this step, the second dielectric layer may be deposited, through vapor-phase deposition such as plasma enhanced chemical vapor deposition, on a top of the structure including the silicon single-photon avalanche detector or the silicon-based germanium single-photon avalanche detector, the silicon grating, and the first dielectric layer. The second dielectric layer may be a dielectric layer of silicon dioxide.

After the second dielectric layer is deposited, the first contact via for the surface-incident silicon single-photon avalanche detector or the silicon-based germanium single-photon avalanche detector is formed downward from the top of the second dielectric layer.

For example, the first contact via may be formed through a copper process, a tungsten process, a gold process, an aluminum process, or an aluminum-copper process.

Hereinafter the single copper damascene process is taken as an example to illustrate a manner of forming the first contact via in detail.

A top of the second dielectric layer is etched downward through a conventional etching technique, to form multiple first holes. An aperture of the first hole is not limited herein, and may be properly configured according to a practical processing condition.

A first isolation layer is deposited on a sidewall and a bottom of the first hole. The first isolation layer may be made of Ta, TaN, or Ta+TaN. The first isolation layer is deposited on an overall structure with the first hole. That is, the first isolation layer is also deposited on the top of the second dielectric layer, when being deposited on the sidewall and the bottom of the first hole.

Afterwards, a first copper-seed layer is deposited in the first hole, which has been provided with the first isolation layer. Similarly, the first copper-seed layer is also deposited on the top of the second dielectric layer, i.e. on the top of the first isolation layer.

Afterwards, copper is filled into the first hole, which has been provided with the first isolation layer and the first copper-seed layer, through an electrochemical coating process (ECP). Similarly, the copper is also deposited on top of the second dielectric layer, i.e. on a top of the first copper-seed layer.

Afterwards, annealing and chemical mechanical polishing are performed to remove the copper, the first copper-seed layer, and the first isolation layer, which are located on a surface of the second dielectric layer. Thereby, the first contact via flush with the top of the second dielectric layer is formed by the first hole, and the first isolation layer, the first copper-seed layer and the copper that are located in the first hole.

The first contact via is in contact with the silicon single-photon avalanche detector or the silicon-based germanium single-photon avalanche detector, and is capable of connecting the silicon single-photon avalanche detector or the silicon-based germanium single-photon avalanche detector to an electrode. Thereby, the silicon single-photon avalanche detector or the silicon-based germanium single-photon avalanche detector can be powered.

Figure 23:
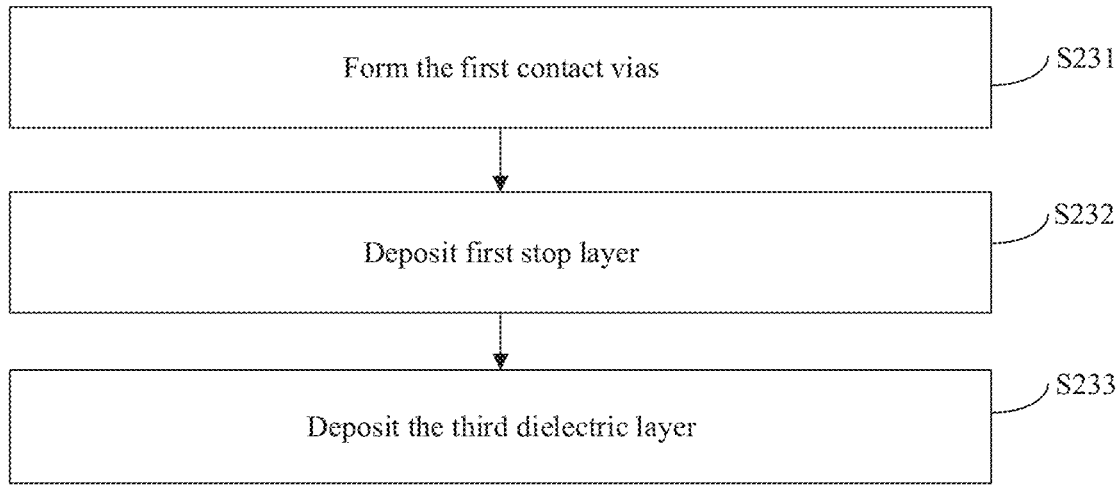
FIG. 23 is a flowchart of sub-steps in depositing a second dielectric layer and depositing a third dielectric layer according to an embodiment of the present disclosure.

After the first contact via is formed by the single copper damascene process, a first stop layer is required to be deposited on the top of the formed structure, so as to prevent the copper from being oxidized in a subsequent process. The first stop layer may be made of silicon nitride. Reference may be made to steps S231 to S233 as shown in FIG. 23.

In a case that the first contact via is formed by the copper process or the gold process, copper or gold is formed in the first hole through electrochemical coating. The copper is annealed and subject to chemical mechanical polishing in the copper process, and the gold is subject to chemical mechanical polishing in the gold process. In a case that the first contact via is formed by the aluminum process or the aluminum-copper process, aluminum or aluminum-copper is deposited in the first hole and then etched. In a case that the first contact via is formed by the tungsten process, tungsten is deposited in the first hole, and then is subject to chemical mechanical polishing.

Figure 24:
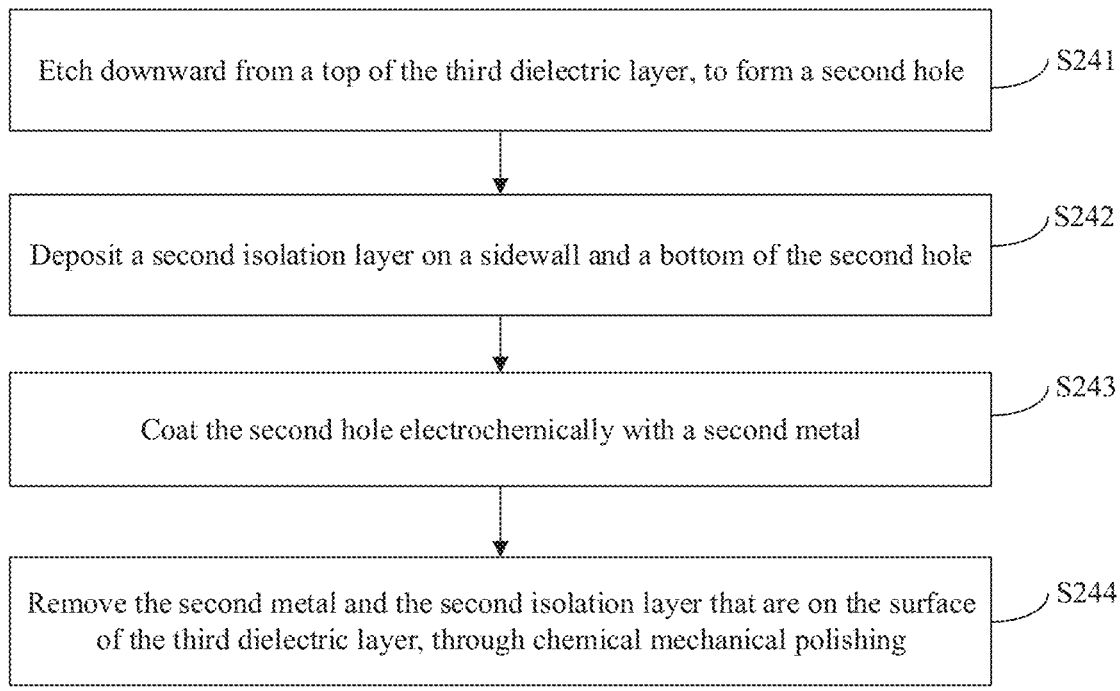
FIG. 24 is a flowchart of sub-steps in depositing a third dielectric layer according to an embodiment of the present disclosure.

In step S13, a third dielectric layer is deposited, and through silicon vias are formed downward from a top of the third dielectric layer. Sub-steps of the step S13 may refer to steps S241 to S244 as shown in FIG. 24.

In this step, the third dielectric layer may be deposited on a top of the second dielectric layer, which has been provided with the first contact via, or the first stop layer through vapor-phase deposition such as plasma enhanced chemical vapor deposition. That is, the first contact via or the first stop layer is completely covered by the third dielectric layer. The third dielectric layer may be a dielectric layer of silicon dioxide.

After the third dielectric layer is formed, the through silicon vias are formed downward from the top of the third dielectric layer.

The through silicon via may be formed be formed through a copper process, a tungsten process, or a gold process, and usually through the copper process.

Hereinafter the single copper damascene process is taken as an example to illustrate a manner of forming the through silicon via in detail.

A second hole may be formed through DRIE etching. An aperture of the second hole is not limited herein, and may be properly configured according to a practical requirement and a DRIE processing condition.

A second isolation layer is deposited on a sidewall and a bottom of the second hole. The second isolation layer may be made of Ta, TaN, or Ta+TaN. The second isolation layer is deposited on an overall structure with the second hole. That is, the second isolation layer is also deposited on the top of the third dielectric layer, when being deposited on the sidewall and the bottom of the second hole.

Afterwards, a second copper-seed layer is deposited in the second hole, which has been provided with the second isolation layer. Similarly, the second copper-seed layer is also deposited on the top of the third dielectric layer, i.e. on the top of the second isolation layer.

Afterwards, copper is filled into the second hole, which has been provided with the second isolation layer and the second copper-seed layer, through an electrochemical coating process. Similarly, the copper is also deposited on top of the third dielectric layer, i.e. on a top of the second copper-seed layer.

Afterwards, annealing and chemical mechanical polishing are performed to remove the copper, the second copper-seed layer, and the second isolation layer, which are located on a surface of the third dielectric layer. Thereby, the through silicon via flush with the top of the third dielectric layer is formed by the second hole, and the second isolation layer, the second copper-seed layer and the copper that are located in the second hole.

Figure 25:
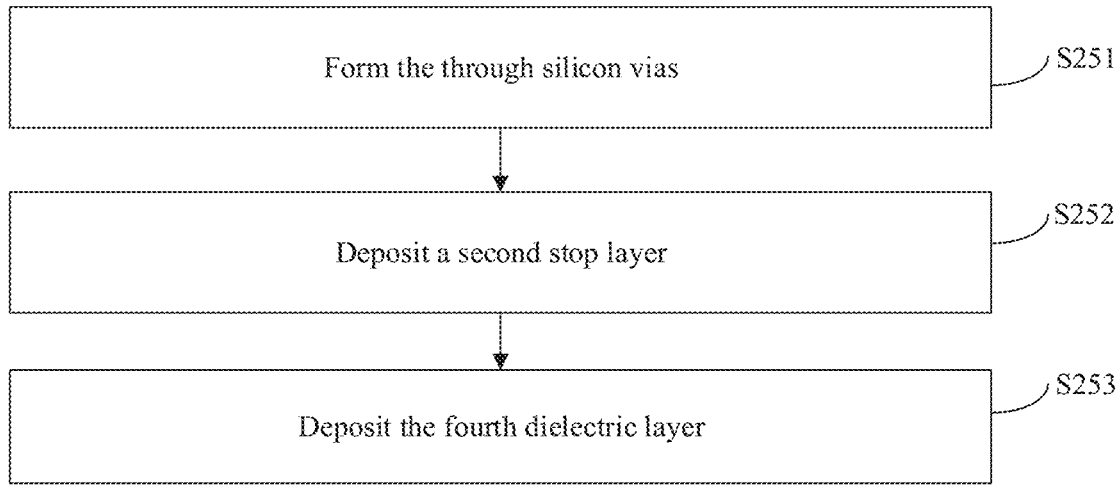
FIG. 25 is a flowchart of sub-steps in depositing a third dielectric layer and depositing a fourth dielectric layer according to another embodiment of the present disclosure.

After the through silicon via is formed by the single copper damascene process, a second stop layer is required to be deposited on the top of the formed structure, so as to prevent the copper from being oxidized in a subsequent process. The second stop layer may be made of silicon nitride. Reference may be made to steps S251 to S253 as shown in FIG. 25.

The through silicon via is capable to achieve vertical interconnection between an electrode of an ion trap chip and an interposer in a lower layer.

There are multiple through silicon vias, which are distributed around the silicon single-photon avalanche detector or the silicon-based germanium single-photon avalanche detector. There is a distance between each through silicon via and the silicon single-photon avalanche detector or the silicon-based germanium single-photon avalanche detector.

For example, a perpendicular distance between each through silicon via and a side, of the silicon single-photon avalanche detector or the silicon-based germanium single-photon avalanche detector, adjacent to said through silicon via is not less than 1.5 times a diameter of each through silicon via. A perpendicular distance between central axes of every two adjacent through silicon vias is not less than 3 times the diameter of each through silicon via.

A preferable distance is set between the through silicon via and the silicon single-photon avalanche detector or the silicon-based germanium single-photon avalanche detector, and another preferable distance is set between adjacent through silicon vias. Thereby, it is prevented that stress at a through silicon via deteriorates a performance of the silicon single-photon avalanche detector or the silicon-based germanium single-photon avalanche detector, or deteriorates formation of another through silicon via.

In a case that the through silicon via is formed by the copper process or the gold process, copper or gold is formed in the second hole through electrochemical coating. The copper is annealed and subject to chemical mechanical polishing in the copper process, and the gold is subject to chemical mechanical polishing in the gold process. In a case that the through silicon via is formed by the tungsten process, tungsten is deposited in the second hole, and then is subject to chemical mechanical polishing.

Figure 26:
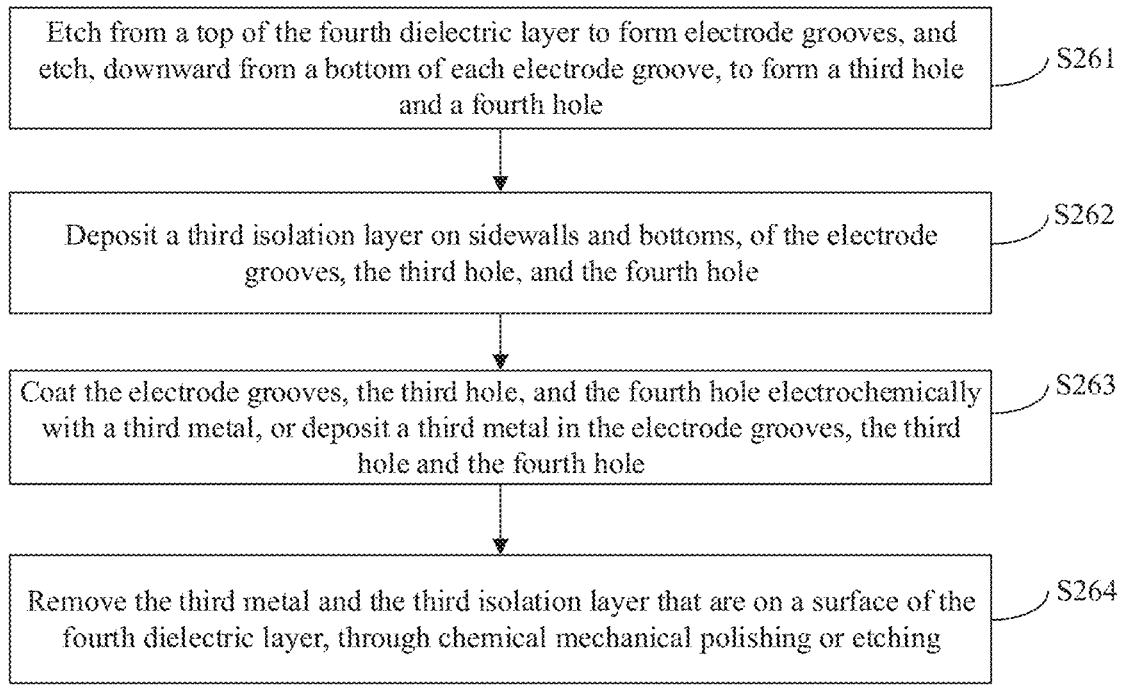
FIG. 26 is a flowchart of sub-steps in depositing a fourth dielectric layer according to an embodiment of the present disclosure.

In step S14, a fourth dielectric layer is deposited, and an electrode is formed on a top of the fourth dielectric layer. The electrode includes a first electrode connected to the silicon single-photon avalanche detector or the silicon-based germanium single-photon avalanche detector, and a second electrode for the surface-electrode ion trap. Each first electrode corresponds to the first contact via and the through silicon via, and each second electrode corresponds to the through silicon via. A second contact via is formed downward from a bottom of each first electrode, and the second via is connected to the first contact via. A third contact via is formed downward from the bottom of each first electrode and a bottom of each second electrode, and the third contact via is connected to the through silicon via. Sub-steps of the step S14 may refer to steps S261 to S264 as shown in FIG. 26.

In this step, the fourth dielectric layer may be deposited through vapor-phase deposition such as plasma enhanced chemical vapor deposition, on a top of the third dielectric layer, which has been provided with the silicon through via, or the second stop layer. That is, the through silicon via or the second stop layer is completely covered by the fourth dielectric layer. The fourth dielectric layer may be a dielectric layer of silicon dioxide.

After the fourth dielectric layer is formed, the electrode, the second contact via, and the third contact via are formed downward from the top of the fourth dielectric layer.

Each of the electrode, the second contact via, and the third contact via may be formed by through a copper process, a tungsten process, a gold process, an aluminum process, or an aluminum-copper process.

Hereinafter the single copper damascene process is taken as an example to illustrate a manner of forming the electrode, the second contact via, and the third contact via in detail.

The fourth dielectric layer is etched through a conventional etching technique, such as dry etching, to form an electrode groove corresponding to the silicon single-photon avalanche detector or the silicon-based germanium single-photon avalanche detector. A bottom of the electrode groove is further etched downward to form a third hole corresponding to the first contact via and a fourth hole corresponding to the through silicon via.

A third isolation layer is deposited on sidewalls and bottoms of the electrode groove, the third hole, and the fourth hole. The third isolation layer may be made of Ta, TaN, or Ta+TaN. The third isolation layer is deposited on an overall structure, which includes the electrode groove, the third hole, and the fourth hole. That is, the third isolation layer is also deposited on the top of the fourth dielectric layer, when being deposited on the sidewalls and the bottoms of the electrode groove, the third hole, and the fourth hole.

Afterwards, a third copper-seed layer is deposited in the electrode groove, the third hole and the fourth hole, which have been provided with the third isolation layer. The third copper-seed layer is also deposited on the top of the fourth dielectric layer, i.e. on the top of the third isolation layer.

Copper is filled into the electrode groove, the third hole, and the fourth hole, which have been provided with the third isolation layer and the third copper-seed layer, through an electrochemical coating process. Similarly, the copper is also deposited on top of the fourth dielectric layer, i.e. on a top of the third copper-seed layer.

Afterwards, annealing and chemical mechanical polishing are performed to remove the copper, the third copper-seed layer, and the third isolation layer, which are located on a surface of the fourth dielectric layer.

Both the first electrode aligned with the silicon single-photon avalanche detector or the silicon-based germanium single-photon avalanche detector and the second electrode for the surface-electrode ion trap are formed by the electrode groove, the third isolation layer, the third copper-seed layer, and the copper. The second contact via is formed by the third hole, the third isolation layer, the third copper-seed layer, and the copper. The first electrode and the first contact via are connected by the second contact via, and thereby the first electrode is connected to the silicon single-photon avalanche detector or the silicon-based germanium single-photon avalanche detector. The third contact via is formed by the fourth hole, the third isolation layer, the third copper-seed layer, and the copper. The first electrode and the through silicon via, and the second electrode and the through silicon via, are connected by the third contact via, and thereby the first electrode and the second electrode are connected to a bottom of the integrated structure.

Annealing and mechanical polishing are performed after the first electrode, the second electrode, the second contact via, and the third contact via are formed. Further, the first electrode and second electrode that have been formed is subject to passivation through a conventional technique.

A grid-type dielectric isolation structure is required to be arranged, in a case that a feature size of the first electrode and the second electrode is greater than 20 microns and are formed by a dual copper damascene process. Thereby, it is prevented that a surface of the copper is concaved due to subsequent chemical mechanical polishing.

In a case that the electrode, the second contact via, and the third contact via are formed by the copper process or the gold process, copper or gold is formed in the electrode grove, the third hole, and the fourth hole, through electrochemical coating. The copper is annealed and subject to chemical mechanical polishing in the copper process, and the gold is subject to chemical mechanical polishing in the gold process. In a case that the electrode, the second contact via, and the third contact via are formed by the aluminum process or the aluminum-copper process, aluminum or aluminum-copper is deposited in the electrode grove, the third hole, and the fourth hole, and then etched. In a case that the electrode, the second contact via, and the third contact via are formed by the tungsten process, tungsten is deposited in the electrode grove, the third hole, and the fourth hole, and then is subject to chemical mechanical polishing.

In step S15, the wafer is grinded from a back surface of the wafer, to expose the through silicon via.

In this step, the front surface of the structure that has been formed may be temporarily bond to a carrier wafer, via a thermoplastic material. The carrier wafer may be a bulk silicon wafer.

The wafer is grinded from the back surface of the wafer through a conventional polishing process, so that the wafer is thinned to expose the through silicon via.

In step S16, a passivation layer is deposited on the back surface of the wafer.

In step S17, the passivation layer is etched to form a passivation layer opening for the through silicon via. Further, a redistribution layer and a first under micro-bump metal, or a redistribution layer and a first micro-bump, are formed in the passivation layer opening. Alternatively, a first under micro-bump metal or a first micro-bump is formed in the passivation layer opening.

In a preferable embodiment, the first micro-bump is formed in the passivation layer opening in this step, through electrochemical coating.

Alternatively, the first under micro-bump metal is formed in the passivation layer opening through electrochemical coating.

Based on the above embodiments, the first under micro-bump metal is made of Cu/Ni/Au, and the first micro-bump is made of Cu/Ni/SnAg.

Figure 4:
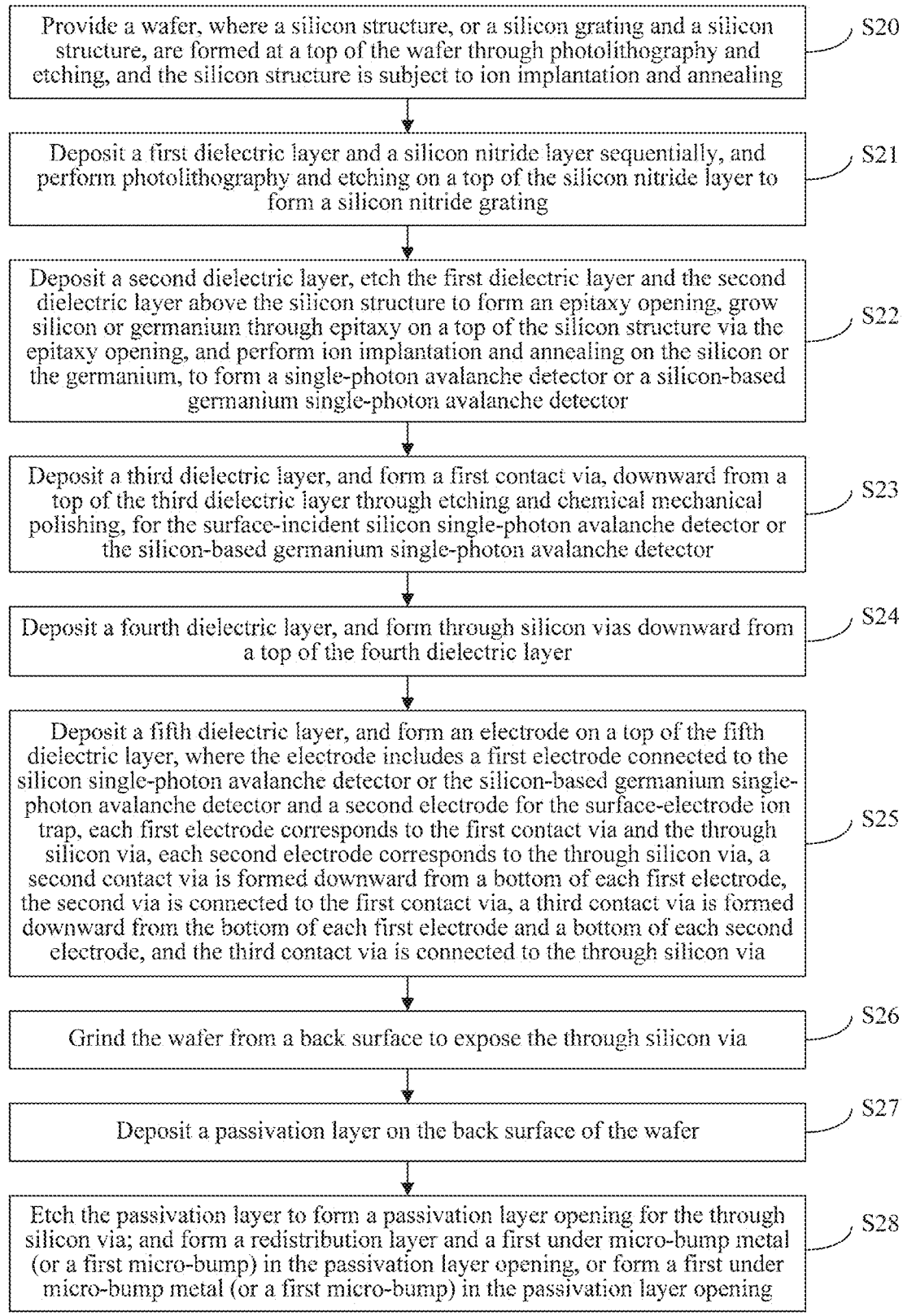
FIG. 4 is a flowchart of a method for integrating a surface-electrode ion trap and a silicon optoelectronic device according to another embodiment of the present disclosure.

A method for integrating a surface-electrode ion trap and a silicon optoelectronic device is further provided according to a second embodiment of the present disclosure. As shown in FIG. 4, the method includes following steps S20 to S28.

In step S20, a wafer is provided. A silicon structure is formed at a top of the wafer through photolithography and etching, or a silicon grating and a silicon structure are formed at a top of the wafer through photolithography and etching. The silicon structure is subject to ion implantation and annealing.

A structure of the wafer provided in this step may be similar to that of the wafer provided in the step S10 of the method for integrating the surface-electrode ion trap and the silicon optoelectronic device according to the first embodiment. A difference from the step S10 lies in that the silicon structure may be formed at the top of the wafer without a silicon grating or with the silicon grating.

In step S21, a first dielectric layer and a silicon nitride layer are sequentially deposited, and a top of the silicon nitride layer is subject to photolithography and etching to form a silicon nitride grating.

In this step, the first dielectric layer may be deposited in a same manner as that in the step S11 of the method for integrating the surface-electrode ion trap and the silicon optoelectronic device according to the first embodiment, which is not repeated herein.

In a preferable embodiment, the silicon nitride layer is deposited through plasma enhanced chemical vapor deposition (PECVD).

The top of the silicon nitride layer is subject to photolithography and etching sequentially through conventional techniques, to form the silicon nitride grating. Similarly, the silicon nitride grating is capable to deflect a laser of a certain wavelength at an angle, which is determined based on a micro-nano structure thereof.

In step S22, a second dielectric layer is deposited, the first dielectric layer and the second dielectric layer that are above the silicon structure is etched to form an epitaxy opening, silicon or germanium are grown through epitaxy on a top of the silicon structure via the epitaxy opening, and ion implantation and annealing are performed on the silicon or the germanium, to form a single-photon avalanche detector or a silicon-based germanium single-photon avalanche detector.

The second dielectric layer may be deposited in a same manner as that in the step S11 of the method for integrating the surface-electrode ion trap and the silicon optoelectronic device according to the first embodiment. The silicon single-photon avalanche detector or the silicon-based germanium single-photon avalanche detector may be formed by the method provided in the step S11 of the method for integrating the surface-electrode ion trap and the silicon optoelectronic device according to the first embodiment. A difference lies that the epitaxy opening in the step S11 runs through the first dielectric layer, while the epitaxy opening in this step runs through both the first dielectric layer and the second dielectric layer in this embodiment.

In step S23, a third dielectric layer is deposited, and a first contact via is formed, downward from a top of the third dielectric layer through etching and chemical mechanical polishing, for the surface-incident silicon single-photon avalanche detector or the silicon-based germanium single-photon avalanche detector.

The method for forming the first contact via in this step is basically same as that in the step S12 of the method for integrating the surface-electrode ion trap and the silicon optoelectronic device according to the first embodiment, which is not repeated herein.

In step S24, a fourth dielectric layer is deposited, and through silicon vias are formed downward from a top of the fourth dielectric layer.

The method for forming through silicon vias in this step is basically same as that in the step S13 of the method for integrating the surface-electrode ion trap and the silicon optoelectronic device according to the first embodiment, which is not repeated herein.

In step S25, a Pith dielectric layer is deposited, and an electrode is formed on a top of the fifth dielectric layer. The electrode includes a first electrode connected to the silicon single-photon avalanche detector or the silicon-based germanium single-photon avalanche detector, and a second electrode for the surface-electrode ion trap. Each first electrode corresponds to the first contact via and the through silicon via, and each second electrode corresponds to the through silicon via. A second contact via is formed downward from a bottom of each first electrode, and the second via is connected to the first contact via. A third contact via is formed downward from the bottom of each first electrode and a bottom of each second electrode, and the third contact via is connected to the through silicon via.

The method for forming the first electrode, the second electrode, the second contact via, and the third contact via in this step is basically same as that in the step S13 of the method for integrating the surface-electrode ion trap and the silicon optoelectronic device according to the first embodiment, which is not repeated herein.

In step S26, the wafer is grinded from a back surface of the wafer, to expose the through silicon via.

This step is same as the step S15 of the method for integrating the surface-electrode ion trap and the silicon optoelectronic device according to the first embodiment, which is not repeated herein.

In step S27, a passivation layer is deposited on the back surface of the wafer.

In step S28, the passivation layer is etched to form a passivation layer opening for the through silicon via. Further, a redistribution layer and a first under micro-bump metal, or a redistribution layer and a first micro-bump, are formed in the passivation layer opening. Alternatively, a first under micro-bump metal or a first micro-bump is formed in the passivation layer opening.

This step is same as the step S17 of the method for integrating the surface-electrode ion trap and the silicon optoelectronic device according to the first embodiment, which is not repeated herein.

Based on the above embodiments, the first under micro-bump metal is made of Cu/Ni/Au, and the first micro-bump is made of Cu/Ni/SnAg.

According to above embodiments of the present disclosure, the surface-electrode ion trap is integrated with the silicon single-photon avalanche detector or the silicon-based germanium single-photon avalanche detector, with the silicon grating and/or the silicon nitride grating, and with a through silicon via. Ions are trapped within a certain range by the surface-electrode ion trap after being powered. A laser source is coupled to the silicon grating and/or the silicon nitride grating through a coupling manner, such as end-coupling. Laser is emitted to the ions in three directions via the silicon gratings and/or the silicon nitride gratings, so as to achieve addressing. The ions are subject to energy level transition after being excited by the laser, and emit fluorescence after the energy level transition. The fluorescence is detected by the silicon single-photon avalanche detector or the silicon-based germanium single-photon avalanche detector, and therefore information of the quantum bits is detected. Compared with conventional addressing and detection in a free spatial domain, a system for adjusting a light path is simplified, requirements of planning and adjusting the light path on space are reduced, the integrated chip is miniaturized, and a degree of integration is improved. It is avoided that the light path is unstable due to interference of external factors such as vibration, when the addressing and detection is in a free-space manner. Moreover, a same integration method may be adopted to integrate adequate silicon single-photon avalanche detectors or the silicon-based germanium single-photon avalanche detectors, through silicon vias, and silicon gratings and/or silicon nitride gratings, according to a quantity of ions required to be trapped in the addressing and detection, which provides good versatility and scalability.

Figure 5:
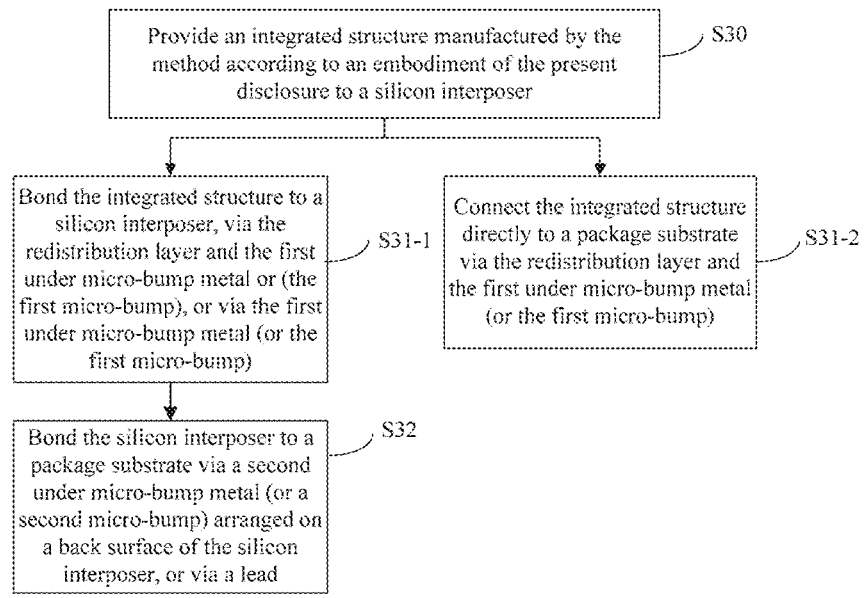
FIG. 5 is a flowchart of a method for manufacturing a structure according to an embodiment of the present disclosure.

A method for manufacturing a three-dimensional structure is further provided, including following steps S30 to S31, as shown in FIG. 5.

In step S30, the integrated structure manufactured by the aforementioned method is provided.

In step S31-1, the integrated structure is bonded to a silicon interposer via the redistribution layer and the first under micro-bump metal, or via the redistribution layer and the first micro-bump. Or, the integrated structure manufactured by the aforementioned method is bonded to a silicon interposer via the first under micro-bump metal or the first micro-bump.

In step S32, the silicon optical interposer is bonded to a package substrate via a second under micro-bump metal or second micro-bump arranged on a back surface of the silicon optical interposer, or via a lead.

Alternatively, in step S31-2, the integrated structure is directly connected to a package substrate via the redistribution layer and the first under micro-bump metal, or via the redistribution layer and the first micro-bump.

A three-dimensional structure and an integrated structure of a surface-electrode ion trap and a silicon optoelectronic device are further provided according to embodiments of the present disclosure, so as to address a technical problem of complicated adjustment of a light path, poor stability, and poor scalability in convention addressing/detection of quantum bits.

Figure 6:
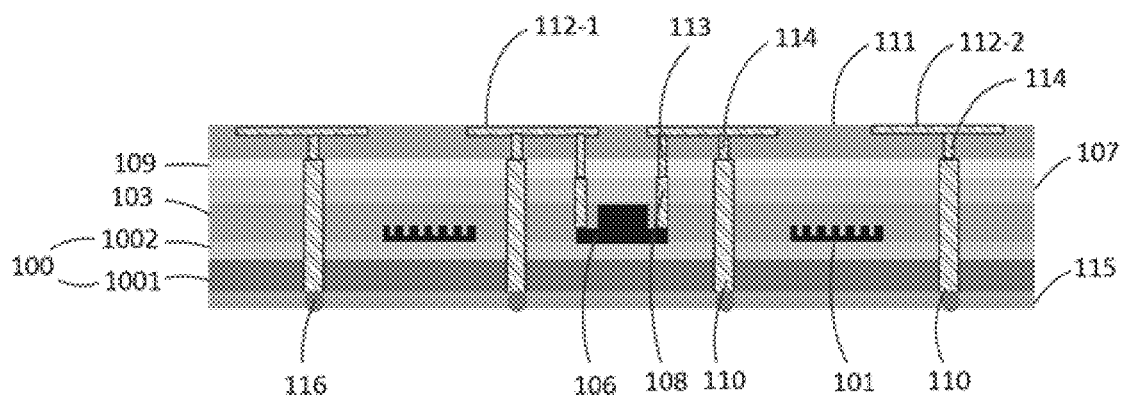
FIG. 6 is a schematic diagram of an overall integrated structure of a surface-electrode ion trap and a silicon optoelectronic device according to an embodiment of the present disclosure.

FIG. 6 is a schematic diagram of an integrated structure of a surface-electrode ion trap and a silicon optoelectronic device according to a third embodiment of the present disclosure. The elements concerning the integrated structure includes a wafer 100, a silicon grating 101, a silicon structure 102, a first dielectric layer 103, an epitaxy opening 104, silicon or germanium 105, a silicon single-photon avalanche detector 106 or a silicon-based germanium single-photon avalanche detector 106, a second dielectric layer 107, a first contact via 108, a third dielectric layer 109, a through silicon via 110, a fourth dielectric layer 111, a first electrode 112-1, a second electrode 112-2, a second contact via 113, a third contact via 114, a passivation layer 115, a passivation layer opening (not shown), a first under micro-bump metal 116 or a first micro-bump 116.

Figure 7:
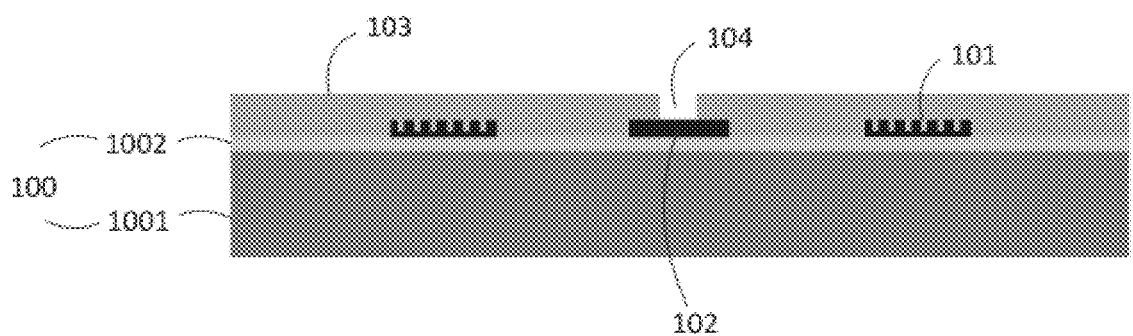
FIGS. 7 to 13 are schematic diagrams in a process of manufacturing an integrated structure of a surface-electrode ion trap and a silicon optoelectronic device according to an embodiment of the present disclosure.
Figure 8:
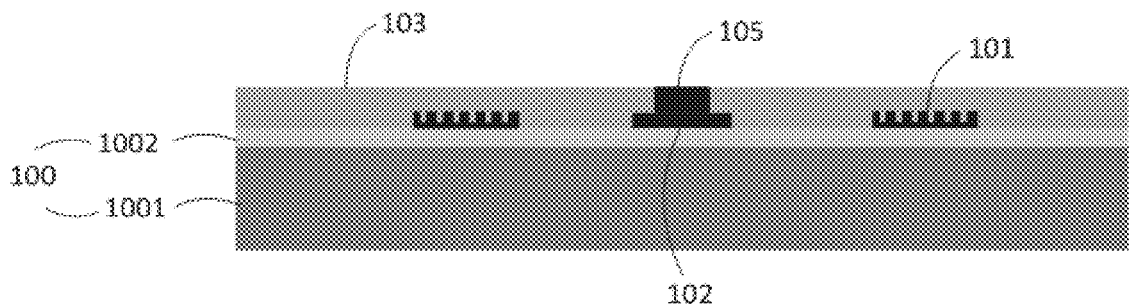

Reference is made to FIGS. 7 and 8. The silicon grating 101 and a silicon structure 102 are formed at a top of the wafer 100 through photolithography and etching. After being formed, the silicon structure 102 is subject to ion implantation and annealing.

The first dielectric layer 103 is formed on the above-formed structure. The first dielectric layer 103 above the silicon structure 102 is etched to form multiple epitaxy openings 104. Silicon or germanium 105 is grown through epitaxy on a top of the silicon structure 102 via the epitaxy openings 104. The silicon or germanium 105 is then subject to ion implantation and annealing, to form multiple silicon single-photon avalanche detectors 106 or the silicon-based germanium single-photon avalanche detectors 106.

The second dielectric layer 107 is formed on the above-formed structure. Multiple first contact vias 108 are formed downward from a top of the second dielectric layer 107 for the surface-incident silicon single-photon avalanche detectors 106 or the silicon-based germanium single-photon avalanche detectors 106.

The third dielectric layer 109 is formed on the above-formed structure. Through silicon vias 110 are formed downward from a top of the third dielectric layer 109.

The fourth dielectric layer 111 is formed on the above-formed structure. Multiple electrodes are formed on a top of the fourth dielectric layer 111. The electrodes include the first electrode 112-1 connected to the silicon single-photon avalanche detectors 106 or the silicon-based germanium single-photon avalanche detectors 106, and a second electrode 112-2 for the surface-electrode ion trap. Each first electrode 112-1 corresponds to the first contact via 108 and the through silicon via 110. Each second electrode 112-2 corresponds to the through silicon via 110. The second contact via 113 is formed downward from the bottom of each first electrode 112-1 and a bottom of each first electrode 112-2, and connected to the first contact via 108. The third contact via 114 is formed downward from a bottom of each second electrode 112-2, and connected to the through silicon via 110.

In a preferable embodiment, the wafer 100 in this step is an SOI (Silicon-On-Insulator) wafer with a high-impedance substrate. The SOI wafer includes a top silicon, a back substrate 1001, and a buried oxide layer 1002 between the two. The top silicon is subject to conventional photolithography and etching techniques, so as to form the silicon grating 101. The silicon grating 101 is capable to deflect a laser of a certain wavelength at an angle, which is determined based on a micro-nano structure thereof.

The silicon structure 102 is formed from the top silicon together with the silicon grating 101. That is, the silicon structure 102 and the silicon grating 101 are formed in a same process under a same parameter of the process.

After being formed, the silicon structure 102 is subject to ion implantation and annealing through a conventional technique. The implanted ions are boron for p-type doping, or phosphorus for n-type doping.

The first dielectric layer 103 is deposited on the top of the wafer 100, which has been provided with the silicon grating 101 and the silicon structure 102, in this step through plasma enhanced chemical vapor deposition (PECVD). In a preferable embodiment, the first dielectric layer 103 is a dielectric layer of silicon dioxide. Alternatively, the first dielectric layer 103 may be of another material capable of isolating.

The epitaxy opening 104 is formed by etching the first dielectric layer 103 above the silicon structure 102. The silicon or the germanium 105 is grown through epitaxy on the top of the silicon structure 102 via the epitaxy opening 104. That is, the silicon or the germanium 105 is formed in a cavity formed by the top of the silicon structure 103 and the epitaxy opening. The silicon or the germanium 105 is then subject to ion implantation and annealing, to form the silicon single-photon avalanche detector 106 or the silicon-based germanium single-photon avalanche detector 106. The implanted ions are boron for p-type doping, or phosphorus for n-type doping.

The silicon single-photon avalanche detector 106 or the silicon-based germanium single-photon avalanche detector 106 includes an absorption layer, a charge layer, and a multiplication layer in physics. The silicon single-photon avalanche detector 106 or the silicon-based germanium single-photon avalanche detector 106 is configured to detect fluorescence generated due to energy level transition of ions.

In a preferable embodiment, when viewed from the top of the formed structure, coverage of the epitaxial silicon or germanium 105 is smaller that of the silicon structure 102, and the epitaxial silicon or germanium 105 is located at a center of the silicon structure 102.

The silicon structure 102 is formed by etching the top silicon of the wafer 100, the silicon or germanium 105 is grown through epitaxy, and then the silicon or germanium 105 is subject to ion implantation and annealing. Thereby, the silicon single-photon avalanche detector 106 or the silicon-based germanium single-photon avalanche detector 106 is integrated on the wafer 100, with a high degree of integration and a small size.

The second dielectric layer 107 may be deposited, through vapor-phase deposition such as plasma enhanced chemical vapor deposition, on a top of the structure including the silicon single-photon avalanche detector 106 or the silicon-based germanium single-photon avalanche detector 106, the silicon grating 101, and the first dielectric layer 103. The second dielectric layer 107 may be a dielectric layer of silicon dioxide.

After the second dielectric layer 107 is deposited, the first contact via 108 for the surface-incident silicon single-photon avalanche detector 106 or the silicon-based germanium single-photon avalanche detector 106 is formed downward from the top of the second dielectric layer 107.

For example, the first contact via 108 may be formed through a copper process, a tungsten process, a gold process, an aluminum process, or an aluminum-copper process.

Figure 9:
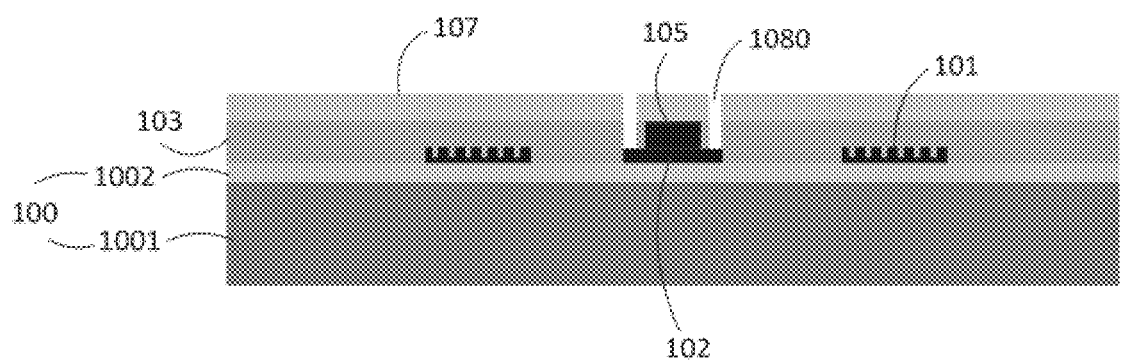
Figure 10:
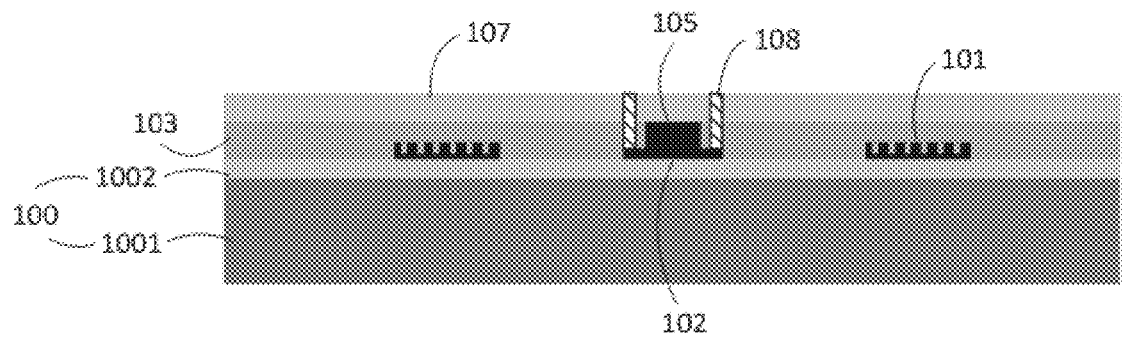

Hereinafter the single copper damascene process is taken as an example to illustrate a manner of forming the first contact via 108 in detail (where reference is made to FIGS. 9 and 10).

A top of the second dielectric layer 107 is etched downward through a conventional etching technique, to form multiple first holes 1080. An aperture of the first hole 1080 is not limited herein, and may be properly configured according to a practical processing condition.

A first isolation layer is deposited on a sidewall and a bottom of the first hole 1080. The first isolation layer may be made of Ta, TaN, or Ta+TaN. The first isolation layer is deposited on an overall structure with the first hole 1080. That is, the first isolation layer is also deposited on the top of the second dielectric layer 107, when being deposited on the sidewall and the bottom of the first hole 1080.

Afterwards, a first copper-seed layer is deposited in the first hole, which has been provided with the first isolation layer. Similarly, the first copper-seed layer is also deposited on the top of the second dielectric layer 107, i.e. on the top of the first isolation layer.

Afterwards, copper is filled into the first hole 1080, which has been provided with the first isolation layer and the first copper-seed layer, through an electrochemical coating process (ECP). Similarly, the copper is also deposited on top of the second dielectric layer 107, i.e. on a top of the first copper-seed layer.

Afterwards, annealing and chemical mechanical polishing are performed to remove the copper, the first copper-seed layer, and the first isolation layer, which are located on a surface of the second dielectric layer. Thereby, the first contact via flush with the top of the second dielectric layer is formed by the first hole 1080, and the first isolation layer, the first copper-seed layer and the copper that are located in the first hole 1080.

The first contact via 108 is in contact with the silicon single-photon avalanche detector 106 or the silicon-based germanium single-photon avalanche detector 106, and is capable of connecting the silicon single-photon avalanche detector 106 or the silicon-based germanium single-photon avalanche detector 106 to an electrode. Thereby, the silicon single-photon avalanche detector 106 or the silicon-based germanium single-photon avalanche detector 106 can be powered.

After the first contact via 108 is formed by the single copper damascene process, a first stop layer (not shown) is required to be deposited on the top of the formed structure, so as to prevent the copper from being oxidized in a subsequent process. The first stop layer may be made of silicon nitride.

In a case that the first contact via 108 is formed by the copper process or the gold process, copper or gold is formed in the first hole 1080 through electrochemical coating. The copper is annealed and subject to chemical mechanical polishing in the copper process, and the gold is subject to chemical mechanical polishing in the gold process. In a case that the first contact via 108 is formed by the aluminum process or the aluminum-copper process, aluminum or aluminum-copper is deposited in the first hole 1080 and then etched. In a case that the first contact via 108 is formed by the tungsten process, tungsten is deposited in the first hole 1080, and then is subject to chemical mechanical polishing.

Figure 11:
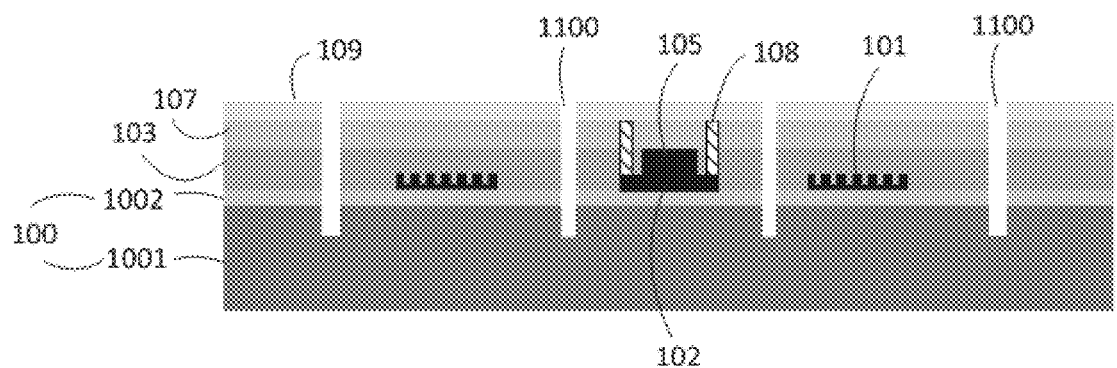
Figure 12:
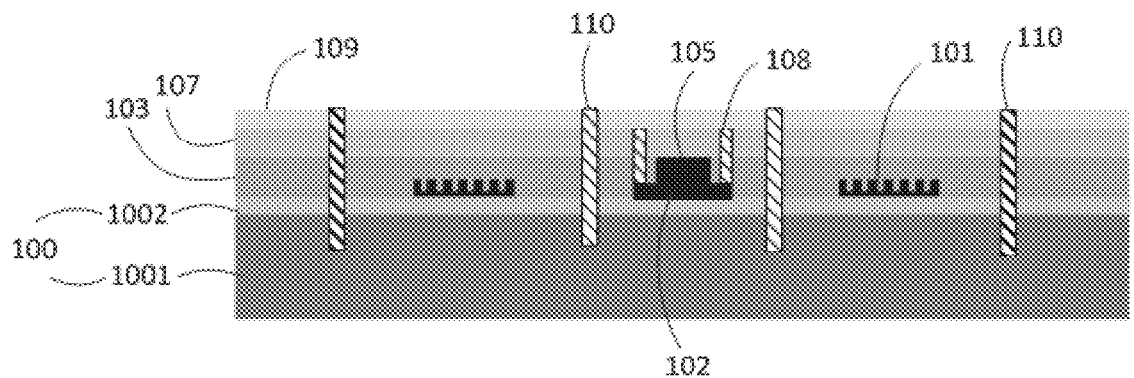

Reference is made to FIGS. 11 and 12. The third dielectric layer 109 may be deposited on a top of the second dielectric layer 107, which has been provided with the first contact via 108, or the first stop layer through vapor-phase deposition such as plasma enhanced chemical vapor deposition. That is, the first contact via 108 or the first stop layer is completely covered by the third dielectric layer 109. The third dielectric layer 109 may be a dielectric layer of silicon dioxide.

After the third dielectric layer 109 is formed, the through silicon vias 110 are formed downward from the top of the third dielectric layer 109.

The through silicon via 110 may be formed through a copper process, a tungsten process, or a gold process, and usually through the copper process.

Hereinafter the single copper damascene process is taken as an example to illustrate a manner of forming the through silicon via 110 in detail.

A second hole 1100 may be formed through DRIE etching. An aperture of the second hole 1100 is not limited herein, and may be may be properly configured according to a practical requirement and a DRIE processing condition.

A second isolation layer is deposited on a sidewall and a bottom of the second hole 1100. The second isolation layer may be made of Ta, TaN, or Ta+TaN. The second isolation layer is deposited on an overall structure with the second hole 1100. That is, the second isolation layer is also deposited on the top of the third dielectric layer 109, when being deposited on the sidewall and the bottom of the second hole 1100.

Afterwards, a second copper-seed layer is deposited in the second hole 1100, which has been provided with the second isolation layer. Similarly, the second copper-seed layer is also deposited on the top of the third dielectric layer 109, i.e. on the top of the second isolation layer.

Afterwards, copper is filled into the second hole 1100, which has been provided with the second isolation layer and the second copper-seed layer, through an electrochemical coating process (ECP). Similarly, the copper is also deposited on top of the third dielectric layer 109, i.e. on a top of the second copper-seed layer.

Afterwards, annealing and chemical mechanical polishing are performed to remove the copper, the second copper-seed layer, and the second isolation layer, which are located on a surface of the third dielectric layer 109. Thereby, the through silicon via 110 flush with the top of the third dielectric layer 109 is formed by the second hole 1100, and the second isolation layer, the second copper-seed layer and the copper that are located in the second hole 1100.

After the through silicon via 110 is formed by the single copper damascene process, a second stop layer (not shown) is required to be deposited on the top of the formed structure, so as to prevent the copper from being oxidized in a subsequent process. The second stop layer may be made of silicon nitride.

The through silicon via 110 is capable to achieve vertical interconnection between an electrode of an ion trap chip and an interposer in a lower layer.

There are multiple through silicon vias 110, which are distributed around the silicon single-photon avalanche detector 106 or the silicon-based germanium single-photon avalanche detector 106. There is a distance between each through silicon via 110 and the silicon single-photon avalanche detector 106 or the silicon-based germanium single-photon avalanche detector 106.

For example, a perpendicular distance between each through silicon via 110 and a side, of the silicon single-photon avalanche detector 106 or the silicon-based germanium single-photon avalanche detector 106, adjacent to said through silicon via 110 is not less than 1.5 times a diameter of each through silicon via 110. A perpendicular distance between central axes of every two adjacent through silicon vias 110 is not less than 3 times the diameter of each through silicon via 110.

A preferable distance is set between the through silicon via 110 and the silicon single-photon avalanche detector 106 or the silicon-based germanium single-photon avalanche detector 106, and another preferable distance is set between adjacent through silicon vias 110. Thereby, it is prevented that stress at a through silicon via 110 deteriorates a performance of the silicon single-photon avalanche detector 106 or the silicon-based germanium single-photon avalanche detector 106, or deteriorates formation of another through silicon via 110.

In a case that the through silicon via 110 is formed by the copper process or the gold process, copper or gold is formed in the second hole 1100 through electrochemical coating. The copper is annealed and subject to chemical mechanical polishing in the copper process, and the gold is subject to chemical mechanical polishing in the gold process. In a case that the through silicon via 110 is formed by the tungsten process, tungsten is deposited in the second hole 1100, and then is subject to chemical mechanical polishing.

Figure 13:
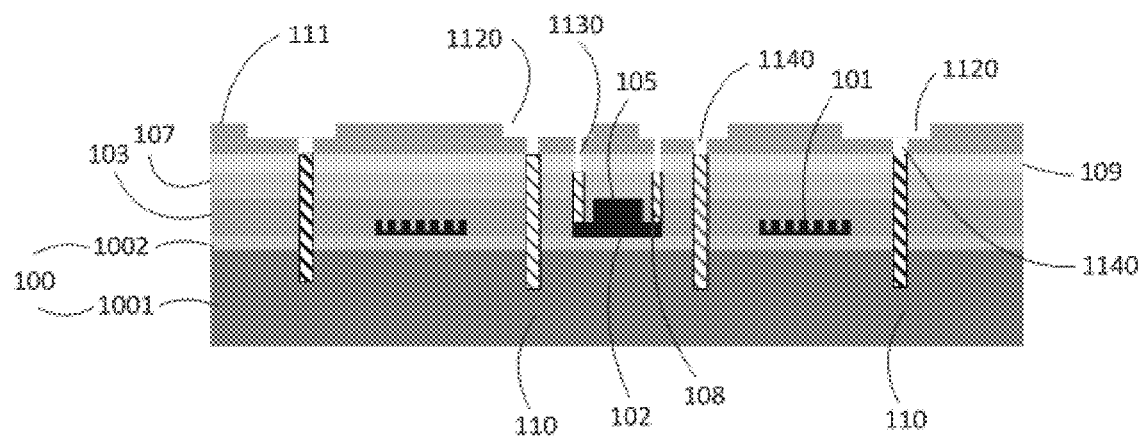

Reference is made to FIGS. 6 and 13. The fourth dielectric layer 111 may be deposited through vapor-phase deposition such as plasma enhanced chemical vapor deposition, on a top of the third dielectric layer 109, which has been provided with the silicon through via 110, or the second stop layer. That is, the through silicon via 110 or the second stop layer is completely covered by the fourth dielectric layer 111. The fourth dielectric layer 111 may be a dielectric layer of silicon dioxide.

After the fourth dielectric layer 111 is formed, the electrode, the second contact via 113, and the third contact via 114 are formed downward from the top of the fourth dielectric layer 111.

Each of the electrode 112, the second contact via 113, and the third contact via 114 may be formed by through a copper process, a tungsten process, a gold process, an aluminum process, or an aluminum-copper process.

Hereinafter the single copper damascene process is taken as an example to illustrate a manner of forming the electrode, the second contact via 113, and the third contact via 114 in detail.

The fourth dielectric layer 111 is etched through a conventional etching technique, such as dry etching, to form an electrode groove 1120. The electrode groove 1120 includes a first electrode groove corresponding to the silicon single-photon avalanche detector or the silicon-based germanium single-photon avalanche detector, and a bottom of the first electrode groove is further etched downward to form a third hole 1130 corresponding to the first contact via 108 and a fourth hole 1140 corresponding to the through silicon via 110. The electrode groove 1120 further includes a second electrode groove for forming the second electrode 112-2, and a bottom of the second electrode groove is further etched downward to form a fourth hole 1140, which corresponds to the through silicon via 110 aligned with the second electrode 112-2.

A third isolation layer is deposited on sidewalls and bottoms of the electrode groove 1120, the third hole 1130, and the fourth hole 1140. The third isolation layer may be made of Ta, TaN, or Ta+TaN. The third isolation layer is deposited on an overall structure, which includes the electrode groove 1120, the third hole 1130, and the fourth hole 1140. That is, the third isolation layer is also deposited on the top of the fourth dielectric layer 111, when being deposited on the sidewalls and the bottoms of the electrode groove 1120, the third hole 1130, and the fourth hole 1140.

Afterwards, a third copper-seed layer is deposited in the electrode groove 1120, the third hole 1130 and the fourth hole 1140, which have been provided with the third isolation layer. The third copper-seed layer is also deposited on the top of the fourth dielectric layer 111, i.e. on the top of the third isolation layer.

Copper is filled into the electrode groove 1120, the third hole 1130, and the fourth hole 1140, which have been provided with the third isolation layer and the third copper-seed layer, through an electrochemical coating process. Similarly, the copper is also deposited on top of the fourth dielectric layer 111, i.e. on a top of the third copper-seed layer.

Afterwards, annealing and chemical mechanical polishing are performed to remove the copper, the third copper-seed layer, and the third isolation layer, which are located on a surface of the fourth dielectric layer 111.

The first electrode 112-1 aligned with the silicon single-photon avalanche detector 106 or the silicon-based germanium single-photon avalanche detector 106 is formed by the electrode groove 1120, the third isolation layer, the third copper-seed layer, and the copper. The second contact via 113 is formed by the third hole 1130, the third isolation layer, the third copper-seed layer, and the copper. The first electrode 112-1 and the first contact via 108 are connected by the second contact via 113, and thereby the first electrode 112-1 is connected to the silicon single-photon avalanche detector 106 or the silicon-based germanium single-photon avalanche detector 106. The third contact via 114 is formed by the fourth hole 1140, the third isolation layer, the third copper-seed layer, and the copper. The first electrode 112-1 and the through silicon via 110 are connected by the third contact via 114, and thereby the first electrode 112-1 and the second electrode are connected to a bottom of the integrated structure. An electrode of the surface-electrode ion trap, i.e. the second electrode 112-2, is formed by the electrode groove 1120, the third isolation layer, the third copper-seed layer, and the copper. The second electrode 112-2 and the corresponding through silicon via 110 are connected by the third contact via 114. The second electrode 112-2 is capable to capture ions and bind the ions within a certain distance.

Annealing and mechanical polishing are performed after the first electrode 112-1, the second electrode 112-2, the second contact via 113, and the third contact via 114 are formed. Further, the first electrode 112-1 and second electrode 112-2 that have been formed is subject to passivation through a conventional technique.

A grid-type dielectric isolation structure (not shown) is required to be arranged, in a case that a feature size of the first electrode 112-1 and the second electrode 112-2 is greater than 20 microns and are formed by a dual copper damascene process. Thereby, it is prevented that a surface of the copper is concaved due to subsequent chemical mechanical polishing.

In a case that the first electrode 112-1, the second electrode 112-2, the second contact via 113, and the third contact via 114 are formed by the copper process or the gold process, copper or gold is formed in the electrode grove 1120, the third hole 1130, and the fourth hole 1140, through electrochemical coating. The copper is annealed and subject to chemical mechanical polishing in the copper process, and the gold is subject to chemical mechanical polishing in the gold process. In a case that the first electrode 112-1, the second electrode 112-2, the second contact via 113, and the third contact via 114 are formed by the aluminum process or the aluminum-copper process, aluminum or aluminum-copper is deposited in the electrode grove 1120, the third hole 1130, and the fourth hole 1140, and then etched. In a case that the first electrode 112-1, the second electrode 112-2, the second contact via 113, and the third contact via 114 are formed by the tungsten process, tungsten is deposited in the electrode grove 1120, the third hole 1130, and the fourth hole 1140, and then is subject to chemical mechanical polishing.

The wafer 100 is grinded from a back surface of the wafer 100k to expose the through silicon via 110, and then a first passivation layer 115 is deposited on the back surface. The first passivation layer 115 is etched to form a passivation layer opening (not shown) for the through silicon via 110. Further, a redistribution layer and a first under micro-bump metal 116, or a redistribution layer and a first micro-bump 116, are formed in the passivation layer opening. Alternatively, a first under micro-bump metal 116 or a first micro-bump 116 is formed in the passivation layer opening.

In this embodiment, the front surface of the structure that has been formed may be temporarily bond to a carrier wafer, via a thermoplastic material. The carrier wafer may be a bulk silicon wafer.

The wafer 100 is grinded from the back surface of the wafer through a conventional polishing process, so that the wafer 100 is thinned to expose the through silicon via 110.

Based on the above embodiments, the first under micro-bump metal is made of Cu/Ni/Au, and the first micro-bump is made of Cu/Ni/SnAg.

Figure 14:
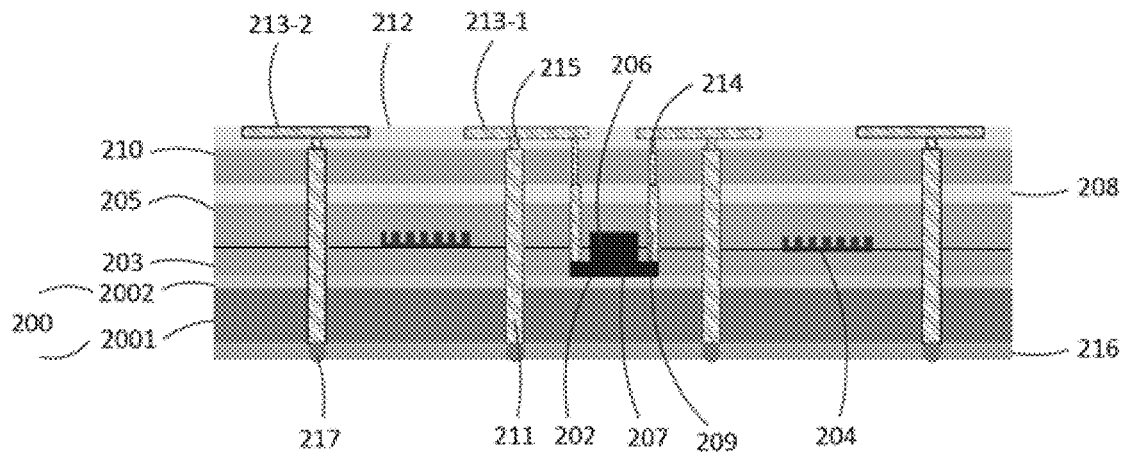
FIGS. 14 and 15 are schematic diagrams of an overall integrated structure of a surface-electrode ion trap and a silicon optoelectronic device according to another embodiment of the present disclosure.
Figure 15:
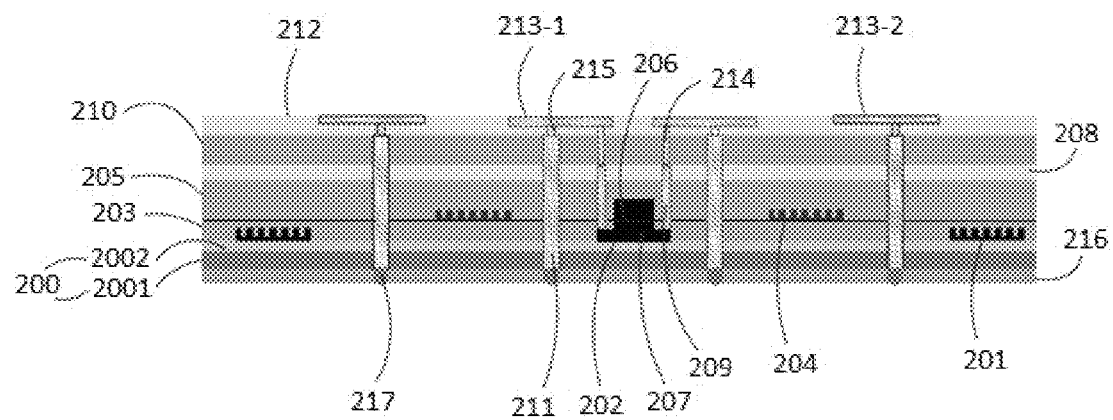
Figure 16:
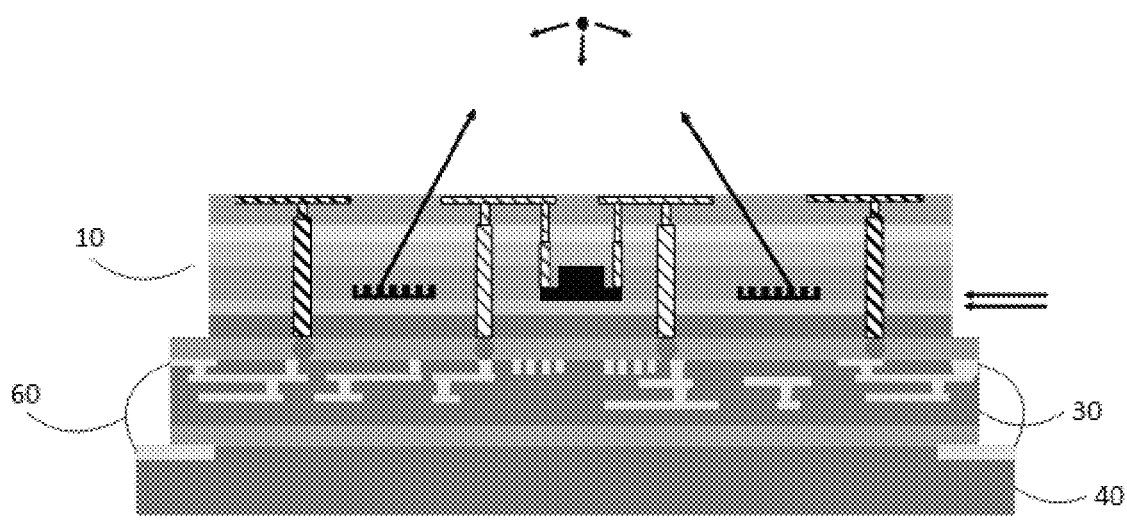
FIGS. 16 to 18 are schematic diagrams of an overall three-dimensional structure according to other embodiments of the present disclosure.
Figure 17:
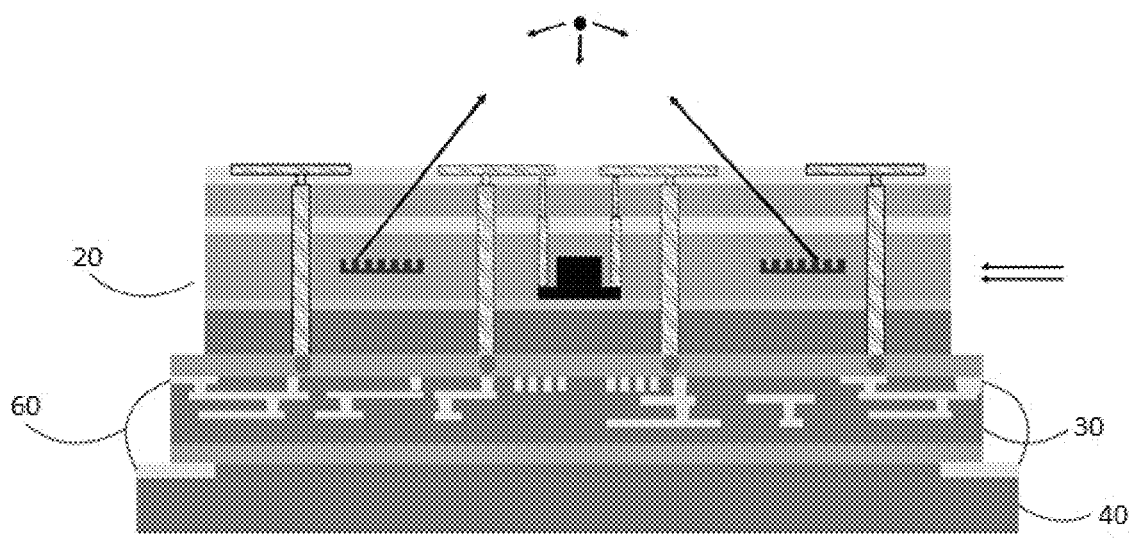
Figure 18:
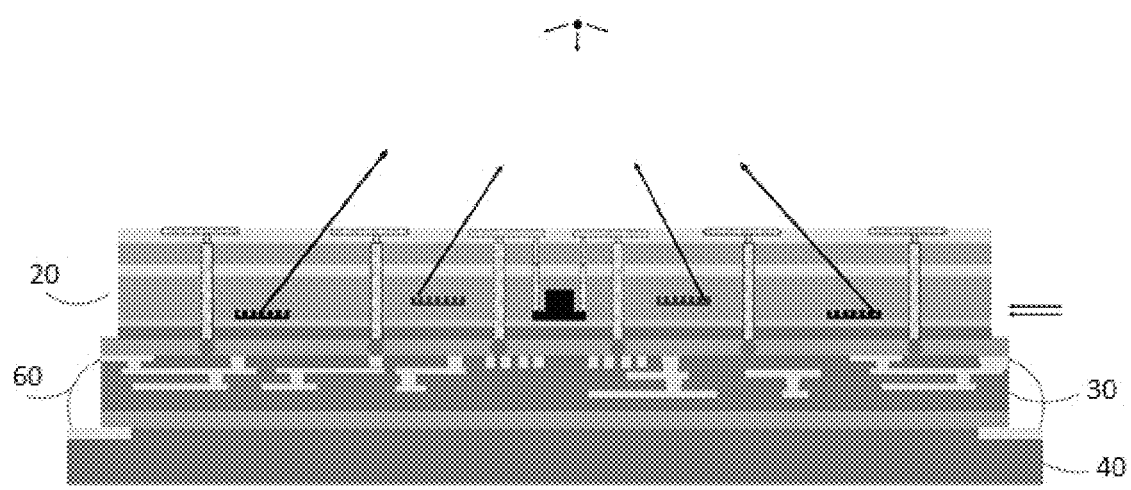
Figure 19:
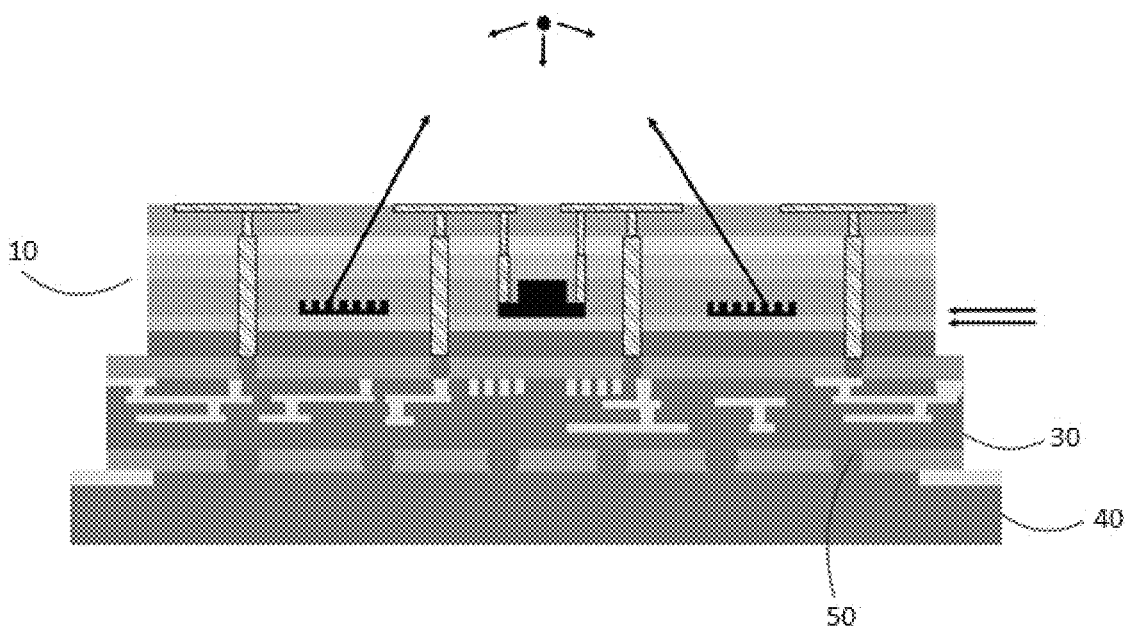
FIGS. 19 to 21 are schematic diagrams of an overall three-dimensional structure according to other embodiments of the present disclosure.
Figure 20:
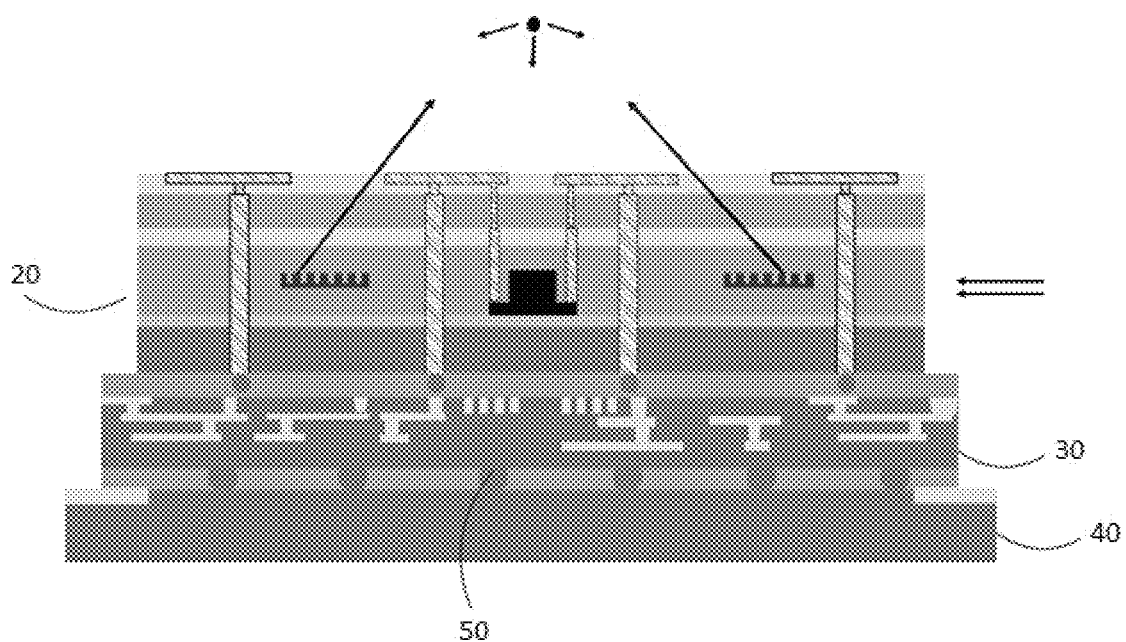
Figure 21:
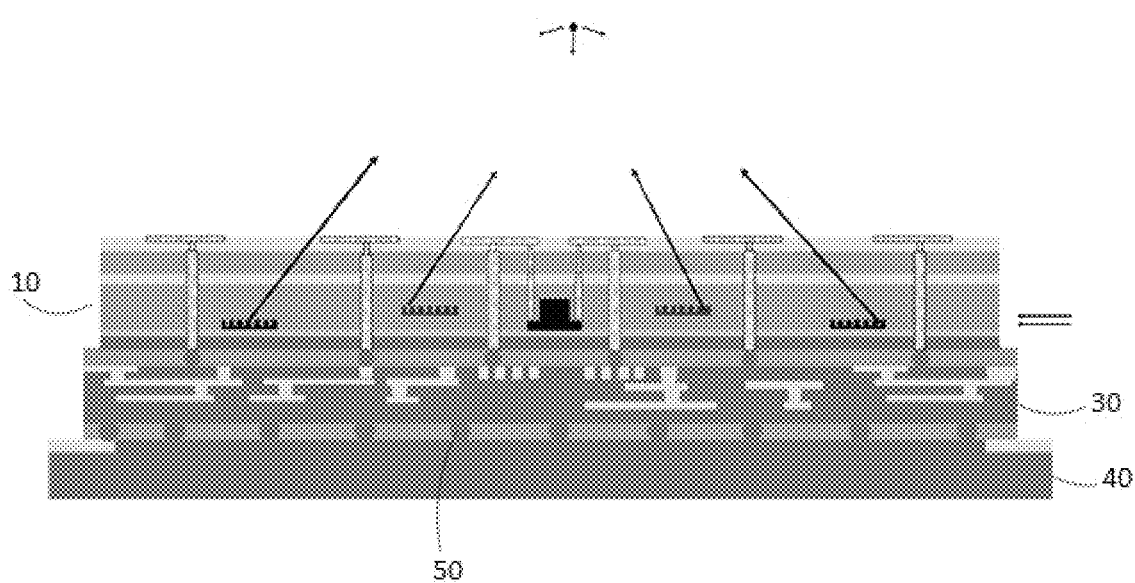

FIGS. 14 and 15 are schematic diagrams of an integrated structure of a surface-electrode ion trap and a silicon optoelectronic device according to a fourth embodiment of the present disclosure. The elements concerning the integrated structure include a wafer 200, a silicon grating 201, a silicon structure 202, a first dielectric layer 203, a silicon nitride grating 204, a second dielectric layer 205, an epitaxy opening (not shown), silicon or germanium 206, a silicon single-photon avalanche detector or a silicon-based germanium single-photon avalanche detector 207, a third dielectric layer 208, a first contact via 209, a fourth dielectric layer 210, a through silicon via 211, a fifth dielectric layer 212, a first electrode 213-1, a second electrode 213-2, a second contact via 214, a third contact via 215, a passivation layer 216, a passivation layer opening (not shown), a first under micro-bump metal 217 or a first micro-bump 217.

A structure of the wafer 200 in this embodiment may be similar to that of the wafer 100 of the integrated structure of the surface-electrode ion trap and the silicon optoelectronic device according to the third embodiment. A difference from the wafer 100 lies in that the silicon structure 202 may be formed at the top of the wafer 200 without a silicon grating 201 or with the silicon grating 201.

The first dielectric layer 203 in this embodiment may be deposited in a same manner as the first dielectric layer 203 of the integrated structure of the surface-electrode ion trap and the silicon optoelectronic device according to the third embodiment, which is not repeated herein.

In a preferable embodiment, the silicon nitride layer is deposited through plasma enhanced chemical vapor deposition (PECVD).

The top of the silicon nitride layer is subject to photolithography and etching sequentially through conventional techniques, to form the silicon nitride grating 204. Similarly, the silicon nitride grating 204 is capable to deflect a laser of a certain wavelength at an angle, which is determined based on a micro-nano structure thereof.

After the silicon nitride grating 204 is formed, the second dielectric layer 205 may be deposited on the structure including the wafer 200, the silicon structure 202, the first dielectric layer 203, the silicon nitride grating 204, or on the structure including the wafer 200, the silicon grating 201, the silicon structure 202, the first dielectric layer 203, the silicon nitride grating 204, in a same manner as that for the integrated structure of the surface-electrode ion trap and the silicon optoelectronic device according to the third embodiment.

The epitaxy opening (not shown) in this embodiment is formed in the first dielectric layer 203 and the second dielectric layer 205 that are located above the silicon structure 202, in a same manner as that for the integrated structure of the surface-electrode ion trap and the silicon optoelectronic device according to the third embodiment.

A shape, a structure, and a fabrication process of the epitaxy opening in this embodiment are same as those of the epitaxy opening 104 in the integrated structure of the surface-electrode ion trap and the silicon optoelectronic device according to the third embodiment, which is not repeated herein.

The silicon or germanium 206 is grown through epitaxy on a top of the silicon structure 202 via the epitaxy opening, and then is subject to ion implantation and annealing, in a same manner as that for the integrated structure of the surface-electrode ion trap and the silicon optoelectronic device according to the third embodiment. Thereby, the silicon single-photon avalanche detector 207 or the silicon-based germanium single-photon avalanche detector 207 in this embodiment is formed.

A structure of the silicon single-photon avalanche detector 207 or the silicon-based germanium single-photon avalanche detector 207 in this embodiment is same as that in the integrated structure of the surface-electrode ion trap and the silicon optoelectronic device according to the third embodiment, which is not repeated herein.

The third dielectric layer 208 is deposited on the above-formed structure, and is subject to etching and chemical mechanical polishing, in a same manner as that for the integrated structure of the surface-electrode ion trap and the silicon optoelectronic device according to the third embodiment. The first contact via 209 is formed, downward from a top of the third dielectric layer 208 through etching and chemical mechanical polishing, for the surface-incident silicon single-photon avalanche detector 207 or the silicon-based germanium single-photon avalanche detector 207.

A structure and a fabrication process of the first contact via 209 in this embodiment are same as those in the integrated structure of the surface-electrode ion trap and the silicon optoelectronic device according to the third embodiment, which not repeated herein.

The fourth dielectric layer 210 is deposited on the above-formed structure, and the through silicon via 211 is formed downward from a top of the fourth dielectric layer 210, in a same manner as that for the integrated structure of the surface-electrode ion trap and the silicon optoelectronic device according to the third embodiment.

A structure and a fabrication process of the through silicon via 211 in this embodiment are same as those in the integrated structure of the surface-electrode ion trap and the silicon optoelectronic device according to the third embodiment, which not repeated herein.

The fifth dielectric layer 212 is deposited on the above-formed structure, and an electrode is formed on a top of the fifth dielectric layer 212, in a same manner as that for the integrated structure of the surface-electrode ion trap and the silicon optoelectronic device according to the third embodiment. The electrode includes a first electrode 213-1 connected to the silicon single-photon avalanche detector 207 or the silicon-based germanium single-photon avalanche detector 207, and a second electrode 213-2 for the surface-electrode ion trap. Each first electrode 213-1 corresponds to the first contact via 209 and the through silicon via 211, and each second electrode 213-2 corresponds to the through silicon via 211. A second contact via 214 is formed downward from a bottom of each first electrode 213-1, and the second via 214 is connected to the first contact via 209. A third contact via 215 is formed downward from the bottom of each first electrode 213-1 and a bottom of each second electrode 213-2, and the third contact via 215 is connected to the through silicon via 211.

Structures and fabrication processes of the electrode, the second contact via 214 and the third contact via 215 in this embodiment are same as those in the integrated structure of the surface-electrode ion trap and the silicon optoelectronic device according to the third embodiment, which not repeated herein.

Materials and fabrication processes of the first dielectric layer 203, the second dielectric layer 205, the third dielectric layer 208, the fourth dielectric layer 210, and the fifth dielectric layer 212 in this embodiment are same as those for any dielectric layer in the integrated structure of the surface-electrode ion trap and the silicon optoelectronic device according to the third embodiment, which not repeated herein.

Structures and fabrication processes of the first passivation layer 216, the passivation layer opening, and the first under micro-bump metal 217 or the first micro-bump 217 in this embodiment are same as those in the integrated structure of the surface-electrode ion trap and the silicon optoelectronic device according to the third embodiment, which not repeated herein.

Based on the above embodiments, a perpendicular distance between each through silicon via 211 and a side, of the silicon single-photon avalanche detector 207 or the silicon-based germanium single-photon avalanche detector 207, adjacent to said through silicon via is not less than 1.5 times a diameter of each through silicon via 211. A perpendicular distance between central axes of every two adjacent through silicon vias 211 is not less than 3 times the diameter of each through silicon via 211.

A preferable distance is set between the through silicon via 211 and the silicon single-photon avalanche detector 207 or the silicon-based germanium single-photon avalanche detector 207, and another preferable distance is set between adjacent through silicon vias 211. Thereby, it is prevented that stress at a through silicon via 211 deteriorates a performance of the silicon single-photon avalanche detector 207 or the silicon-based germanium single-photon avalanche detector 207, or deteriorates formation of another through silicon via 211.

An essential difference between this embodiment and the third embodiment for the integrated structure of the surface-electrode ion trap and the silicon optoelectronic device is as follows. In this embodiment, there may be only the silicon single-photon avalanche detector 207 or the silicon-based germanium single-photon avalanche detector 207 on the wafer 200, and the silicon nitride grating 204 is formed from the silicon nitride layer. Alternatively, in this embodiment, there may be both the silicon single-photon avalanche detector 207 (or the silicon-based germanium single-photon avalanche detector 207) and the silicon grating 201 on the wafer 200, and the silicon nitride grating 204 is formed from the silicon nitride layer.

A three-dimensional structure is further provided. Reference is made to FIGS. 16 to 21, where the three-dimensional structure includes the integrated structure 10/20 according to the above embodiments, a silicon interposer 30, and a package substrate 40.

The silicon interposer 30 is bonded to the integrated structure 10/20 via the first under micro-bump metal or the first micro-bump.

The package substrate 40 is bonded to the silicon interposer 30 via a second under micro-bump metal 50 or a second micro bump 50 arranged on a back surface of the silicon interposer 30, or bonded to the silicon interposer 30 via a lead 60.

Alternatively, the package substrate 40 is directly connected to the integrated structure 10/20 via the first under micro-bump metal or the first micro-bump.

Based on the above embodiments, the second under micro-bump metal is made of Cu/Ni/Au, and the second micro-bump is made of Cu/Ni/SnAg.

The silicon interposer 30 is provided with an internal circuit.

According to embodiments of the present disclosure, the surface-electrode ion trap is integrated with the silicon single-photon avalanche detector or the silicon-based germanium single-photon avalanche detector, with the silicon grating and/or the silicon nitride grating, and with a through silicon via. Ions are trapped within a certain range by the surface-electrode ion trap after being powered. A laser source is coupled to the silicon grating and/or the silicon nitride grating through a coupling manner, such as end-coupling. Alternatively, the layer source is integrated to the silicon grating and/or the silicon nitride grating through an on-chip light source technique. Laser is emitted to the ions in three directions via the silicon gratings and/or the silicon nitride gratings, so as to achieve addressing. The ions are subject to energy level transition after being excited by the laser, and emit fluorescence after the energy level transition. The fluorescence is detected by the silicon single-photon avalanche detector or the silicon-based germanium single-photon avalanche detector, and therefore information of the quantum bits is detected. Compared with conventional addressing and detection in a free spatial domain, a system for adjusting a light path is simplified, requirements of planning and adjusting the light path on space are reduced, the integrated chip is miniaturized, and a degree of integration is improved. It is avoided that the light path is unstable due to interference of external factors such as vibration, when the addressing and detection is in a free-space manner. Moreover, a same integration method may be adopted to integrate adequate silicon single-photon avalanche detectors or the silicon-based germanium single-photon avalanche detectors, through silicon vias, and silicon gratings and/or silicon nitride gratings, according to a quantity of ions required to be trapped in the addressing and detection, which provides good versatility and scalability.

The foregoing embodiments are only preferable embodiments of the present disclosure, and do not limit the present disclosure in any form. Various modifications and changes may be made to the present disclosure by those skilled in the art. Any modification, equivalent replacement, improvement, or the like made within the spirit and principle of the present disclosure should fall within the protection scope of the present disclosure.

The invention claimed is:

1. A method for integrating a surface-electrode ion trap and a silicon optoelectronic device, comprising:
   providing a wafer;
   forming a silicon structure at a top layer of the wafer;
   forming a grating on the wafer;
   depositing a first dielectric layer above the grating and the silicon structure, wherein an epitaxy opening runs through the first dielectric layer above the silicon structure;
   providing epitaxial silicon or epitaxial germanium in the epitaxy opening, wherein ions are implanted into the epitaxial silicon or the epitaxial germanium, to form single-photon avalanche detectors;
   depositing a second dielectric layer above the first dielectric layer, wherein first contact vias run through the second dielectric layer and are connected to the single-photon avalanche detectors;
   depositing a third dielectric layer above the second dielectric layer, wherein through silicon vias run through the third dielectric layer and reach the wafer;
   depositing a fourth dielectric layer above the third dielectric layer, wherein electrodes are located at a top layer of the fourth dielectric layer, second contact vias and third contact vias run from a bottom of the electrodes through the fourth dielectric layer, the electrodes comprise a first electrode for the single-photon avalanche detectors and a second electrode for the surface-electrode ion trap, and the first contact vias are connected to the first electrode via the second contact vias, and the through silicon vias are connected to the first electrode and the second electrode via the third contact vias;
   depositing a passivation layer on a back surface of the wafer, wherein passivation layer openings for the through silicon vias run through the passivation layer to expose the through silicon vias, and a first under micro-bump metal or a first micro-bump is located in each passivation layer opening, or a first under micro-bump metal or a first micro-bump is located on a redistribution layer in each passivation layer opening.

2. The method according to claim 1, wherein forming the grating on the wafer comprises:
   forming a silicon grating at the top layer of the wafer.

3. The method according to claim 1, wherein forming the grating on the wafer comprises:
   depositing a fifth dielectric layer above the wafer;
   depositing a silicon nitride layer above the fifth dielectric layer, and forming a silicon nitride grating at a top layer of the silicon nitride layer, wherein the fifth dielectric layer above the silicon structure is further etched to form the epitaxy opening.

4. The method according to claim 1, wherein depositing the second dielectric layer above the first dielectric layer comprises:
   etching downward from a top the second dielectric layer, to form a first hole;
   depositing a first isolation layer on a sidewall and a bottom of the first hole;
   coating the first hole electrochemically with a first metal, or depositing a first metal in the first hole;
   removing the first metal and the first isolation layer that are on a surface of the second dielectric layer, through chemical mechanical polishing or etching.

5. The method according to claim 4, wherein:
   the first metal is copper;
   the first hole is filled with the copper through electrochemical coating, and the copper is annealed and subject to chemical mechanical polishing;
   a first stop layer is deposited after forming the first contact vias and before depositing the third dielectric layer.

6. The method according to claim 5, wherein depositing the third dielectric layer above the second dielectric layer comprises:
   etching downward from a top of the third dielectric layer, to form a second hole;
   depositing a second isolation layer on a sidewall and a bottom of the second hole;
   coating the second hole electrochemically with a second metal;
   removing the second metal and the second isolation layer that are on the surface of the third dielectric layer, through chemical mechanical polishing.

7. The method according to claim 6, wherein:
   the second metal is copper;
   the second hole is filled with the copper through electrochemical coating, and the copper annealed and subject to chemical mechanical polishing; and
   a second stop layer is deposited after forming the through silicon vias and before depositing the fourth dielectric layer.

8. The method according to claim 7, wherein depositing the fourth dielectric layer above the third dielectric layer comprises:

etching from a top of the fourth dielectric layer to form electrode grooves, and etching, downward from a bottom of each electrode groove, to form a third hole and a fourth hole;

depositing a third isolation layer on sidewalls and bottoms, of the electrode grooves, the third hole, and the fourth hole;

coating the electrode grooves, the third hole, and the fourth hole electrochemically with a third metal, or depositing a third metal in the electrode grooves, the third hole and the fourth hole; and removing the third metal and the third isolation layer that are on a surface of the fourth dielectric layer, through chemical mechanical polishing or etching.

9. The method according to claim 8, wherein each of the first isolation layer, the second isolation layer, and the third isolation layer is made of Ta, TaN, or a combination of Ta and TaN.

10. The method according to claim 8, wherein each of the first hole, the third hole, the fourth hole, and the electrode grooves is formed through dry etching; and the second hole is formed through deep reacting ion etching (DRIE) etching.

11. The method according to claim 7, wherein each of the first stop layer and the second stop layer is made of silicon nitride.

12. The method according to claim 1, wherein each of the first dielectric layer, the second dielectric layer, the third dielectric layer, and the fourth dielectric layer is a dielectric layer of silicon dioxide.

13. The method according to claim 1, wherein each of the first dielectric layer, the second dielectric layer, the third dielectric layer, and the fourth dielectric layer is formed through plasma enhanced chemical vapor deposition.

14. The method according to claim 1, wherein:

a perpendicular distance between each through silicon via and a side of a nearest one of the single-photon avalanche detectors is not less than 1.5 times a diameter of each through silicon via;

a perpendicular distance between central axes of every two adjacent through silicon vias is not less than 3 times the diameter of each through silicon via.

15. A method for manufacturing a three-dimensional structure, comprising:

performing the method according to claim 1, to acquire an integrated structure; and further comprising;
bonding the integrated structure to a silicon interposer via the redistribution layer and the first under micro-bump metal or the first micro-bump, or via the first under micro-bump metal or the first micro-bump; and connecting the silicon interposer to a package substrate, via a second under micro-bump metal or a second micro-bump arranged on a back surface of the silicon interposer, or via a lead; or connecting the integrated structure to a package substrate directly via the redistribution layer and the first under micro-bump metal or first micro-bump of the integrated structure.

16. The method according to claim 15, wherein the second under micro-bump metal is made of Cu/Ni/Au, and the second micro-bump is made of Cu/Ni/SnAg.

17. An integrated structure of a surface-electrode ion trap and a silicon optoelectronic device, comprising:
a wafer;
a silicon structure, located at a top layer of the wafer;

a grating, located on the wafer;
a first dielectric layer, located above the grating and the silicon structure, wherein an epitaxy opening runs through the first dielectric layer above the silicon structure;

single-photon avalanche detectors, comprising epitaxial silicon or epitaxial germanium located in the epitaxy opening, and ions are implanted into the epitaxial silicon or epitaxial germanium;

a second dielectric layer, located above the first dielectric layer, wherein first contact vias run through the second dielectric layer and are connected to the single-photon avalanche detectors;

a third dielectric layer, located above the second dielectric layer, wherein through silicon vias run through the third dielectric layer and reach a back surface of the wafer;

a fourth dielectric layer, located above the third dielectric layer, wherein:
  electrodes are located at a top layer the fourth dielectric layer;
  second contact vias and third contact vias run from a bottom of the electrodes through the fourth dielectric layer;
  the electrodes comprise a first electrode for the single-photon avalanche detectors and a second electrode for the surface-electrode ion trap;
  the first contact vias are connected to the first electrode via the second contact vias, and the through silicon vias are connected to the first electrode and the second electrode via the third contact vias; and a first passivation layer, located on the back surface of the wafer, wherein passivation layer openings for the through silicon vias run through the passivation layer to expose the through silicon vias;

wherein a first under micro-bump metal or a first micro-bump is located in each passivation layer opening, or a first under micro-bump metal or a first micro-bump is located on a redistribution layer in each passivation layer opening.

18. The integrated structure according to claim 17, wherein the grating comprises a silicon grating, and the silicon grating is located at the top layer of the wafer.

19. The integrated structure according to claim 17, further comprising:

a fifth dielectric layer located above the wafer; and
a silicon nitride layer located above the fifth dielectric layer, wherein the grating comprises a silicon nitride grating, the nitride grating is located at a top layer of the silicon nitride layer;

wherein the epitaxy opening runs through the fifth dielectric layer above the silicon structure.

20. A three-dimensional structure, comprising:
the integrated structure according to claim 17; and
the three-dimensional structure further comprises:
  a silicon interposer and a package substrate, wherein the silicon interposer is bonded to the first under micro-bump metal or the first micro-bump of the integrated structure, and the package substrate is bonded to the silicon interposer via a second under micro-bump metal or a second micro bump arranged on a back surface of the silicon interposer, or bonded to the silicon interposer via a lead; or
  a package substrate, directly connected to the first under micro-bump metal or the first micro-bump of the integrated structure.

* * * * *